US011651995B2

(12) United States Patent
Kim et al.

(10) Patent No.: US 11,651,995 B2
(45) Date of Patent: May 16, 2023

(54) MEMORY DEVICES

(71) Applicant: SAMSUNG ELECTRONICS CO., LTD., Suwon-si (KR)

(72) Inventors: Sangkuk Kim, Seongnam-si (KR); Yunseung Kang, Seoul (KR); Oik Kwon, Yongin-si (KR); Jungik Oh, Seoul (KR); Sujin Jeon, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 327 days.

(21) Appl. No.: 17/026,525

(22) Filed: Sep. 21, 2020

(65) Prior Publication Data

US 2021/0202311 A1    Jul. 1, 2021

(30) Foreign Application Priority Data

Dec. 30, 2019    (KR) .................. 10-2019-0178507

(51) Int. Cl.
*H01L 23/532*    (2006.01)
*H01L 45/00*    (2006.01)
(Continued)

(52) U.S. Cl.
CPC .. *H01L 21/76885* (2013.01); *H01L 21/76834* (2013.01); *H01L 27/224* (2013.01); *H01L 27/2427* (2013.01); *H01L 27/2481* (2013.01); *H01L 43/12* (2013.01); *H01L 45/1675* (2013.01); *H01L 45/1683* (2013.01); *H01L 23/53223* (2013.01); *H01L 23/53238* (2013.01); *H01L 23/53252* (2013.01);
(Continued)

(58) Field of Classification Search
CPC ......... H01L 21/76885; H01L 21/76834; H01L 27/224; H01L 27/2427; H01L 27/2481; H01L 43/12; H01L 45/1675; H01L 45/1683; H01L 23/53223; H01L 23/53238; H01L 23/53252; H01L 23/53266; H01L 43/02; H01L 45/06; H01L 45/141; H01L 27/2409; H01L 45/04; H01L 27/222; H01L 27/2463; H01L 43/08; H01L 45/122; H01L 43/10; H01L 45/1253; H01L 45/14; G11C 11/161; G11C 13/0004
See application file for complete search history.

(56) References Cited

U.S. PATENT DOCUMENTS 8,431,492 B2    4/2013    Herner
8,614,135 B2 *  12/2013    Eun ..................... H01L 45/06
                                                    257/E21.663
(Continued)

*Primary Examiner* — David Vu
(74) *Attorney, Agent, or Firm* — Lee IP Law, P.C.

(57) ABSTRACT

A memory device including a plurality of first conductive lines arranged on a substrate and spaced apart from each other in a first direction parallel to a top surface of the substrate; a plurality of capping liners on sidewalls of each of the plurality of first conductive lines, the plurality of capping liners having top surfaces at a vertical level equal to top surfaces of the plurality of first conductive lines, and bottom surfaces at a vertical level higher than bottom surfaces of the plurality of first conductive lines; and an insulating layer on the substrate, the insulating layer filling spaces between the plurality of first conductive lines and covering sidewalls of the plurality of capping liners.

20 Claims, 26 Drawing Sheets

(51) Int. Cl.
　　　*H01L 21/768*　　(2006.01)
　　　*H01L 27/24*　　　(2006.01)
　　　*H01L 27/22*　　　(2006.01)
　　　*H01L 43/12*　　　(2006.01)
　　　*H01L 43/02*　　　(2006.01)

(52) U.S. Cl.
　　　CPC ........ *H01L 23/53266* (2013.01); *H01L 43/02* (2013.01); *H01L 45/06* (2013.01); *H01L 45/141* (2013.01)

(56) References Cited

U.S. PATENT DOCUMENTS

| | | |
|---|---|---|
| 9,136,307 B2 | 9/2015 | Pellizzer |
| 9,484,196 B2 | 11/2016 | Song et al. |
| 9,806,129 B2 | 10/2017 | Ravasio et al. |
| 9,941,333 B2 | 4/2018 | Jeong et al. |
| 2009/0098728 A1 | 4/2009 | Grunow et al. |

* cited by examiner

MEMORY DEVICES

CROSS-REFERENCE TO RELATED APPLICATION

Korean Patent Application No. 10-2019-0178507, filed on Dec. 30, 2019, in the Korean Intellectual Property Office, and entitled: "Memory Devices," is incorporated by reference herein in its entirety.

BACKGROUND

1. Field

Embodiments relate to a memory device.

2. Description of the Related Art

The demand for high integration of memory devices has increased according to the trend for electronic products that are light and compact. Memory devices having three-dimensional cross point structures in which a memory cell is arranged at a cross point between two conductive lines crossing each other have been considered.

SUMMARY

The embodiments may be realized by providing a memory device including a plurality of first conductive lines arranged on a substrate and spaced apart from each other in a first direction parallel to a top surface of the substrate; a plurality of capping liners on sidewalls of each of the plurality of first conductive lines, the plurality of capping liners having top surfaces at a vertical level equal to top surfaces of the plurality of first conductive lines, and bottom surfaces at a vertical level higher than bottom surfaces of the plurality of first conductive lines; and an insulating layer on the substrate, the insulating layer filling spaces between the plurality of first conductive lines and covering sidewalls of the plurality of capping liners.

The embodiments may be realized by providing a memory device including a plurality of first conductive lines on a substrate and spaced apart from each other in a first direction parallel to a top surface of the substrate; a plurality of second conductive lines on the substrate and spaced apart from each other in a second direction parallel to the top surface of the substrate and at a vertical level lower than the plurality of first conductive lines; a plurality of memory cells respectively arranged between the plurality of first conductive lines and the plurality of second conductive lines; and a plurality of capping liners on sidewalls of each of the plurality of first conductive lines, the plurality of capping liners having top surfaces at a vertical level equal to top surfaces of the plurality of first conductive lines and bottom surfaces at a vertical level higher than bottom surfaces of the plurality of first conductive lines.

The embodiments may be realized by providing a memory device including a plurality of first conductive lines on a substrate and spaced apart from each other in a first direction parallel to a top surface of the substrate; a plurality of second conductive lines on the substrate and spaced apart from each other in a second direction parallel to the top surface of the substrate and at a vertical level lower than the plurality of first conductive lines; a plurality of first memory cells respectively between the plurality of first conductive lines and the plurality of second conductive lines; a plurality of first capping liners on upper sidewalls of each of the plurality of first conductive lines; and an insulating layer on the substrate, the insulating layer filling spaces between the plurality of first conductive lines, wherein the upper sidewalls of the plurality of first conductive lines are covered by the plurality of first capping liners, and lower sidewalls of the plurality of first conductive lines are covered by the insulating layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
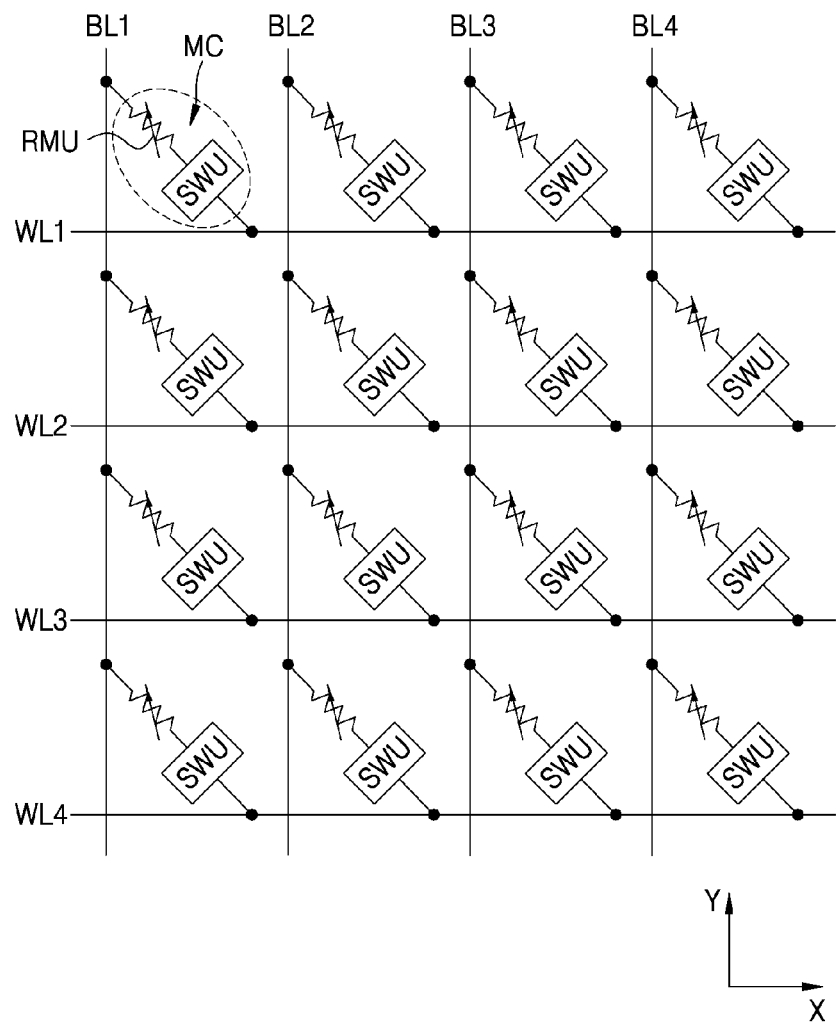
FIG. 1 is an equivalent circuit diagram of a memory device according to example embodiments.

FIG. 1 is an equivalent circuit diagram of a memory device 10 according to example embodiments.

Referring to FIG. 1, the memory device 10 may include a plurality of word lines WL1, WL2, WL3, and WL4 extending in a first direction (X direction of FIG. 1) and a plurality of bit lines BL1, BL2, BL3, and BL4 extending in a second direction (Y direction of FIG. 1) perpendicular to the first direction. A plurality of memory cells MC may be respectively connected to the plurality of word lines WL1, WL2, WL3, and WL4 and the plurality of bit lines BL1, BL2, BL3, and BL4. Each of the plurality of memory cells MC may include a variable resistance memory unit RMU for storing information and a switching unit SWU for selecting a memory cell MC. The switching unit SWU may be referred to as a selection device or an access device.

In an implementation, as the switching unit SWU of the memory cell MC selected through the plurality of word lines WL1, WL2, WL3, and WL4 and the plurality of bit lines BL1, BL2, BL3, and BL4 is turned on, a voltage may be applied to the variable resistance memory unit RMU of the selected memory cell MC to enable current to flow in the variable resistance memory unit RMU. In an implementation, the variable resistance memory unit RMU may include a phase change material layer capable of reversibly transitioning between a first state and a second state. In an implementation, the variable resistance memory unit RMU may include a suitable variable resistor having a resistance value varying according to an applied voltage. In an implementation, the resistance of the variable resistance memory unit RMU may reversibly transition between the first state and the second state according to a voltage applied to the variable resistance memory unit RMU of the selected memory cell MC.

According to changes in the resistance of the variable resistance memory unit RMU, the memory cell MC may store digital information such as "0" or "1," and the digital information may be erased from the memory cell MC. In an implementation, data may be written in the memory cell MC in a high resistance state "0" and a low resistance state "1". In an implementation, the memory cell MC may store various resistance states.

A random or desired memory cell MC may be addressed by selections of the word lines WL1, WL2, WL3, and WL4 and the bit lines BL1, BL2, BL3, and BL4, and information according to a resistance value of the variable resistance memory unit RMU constituting the corresponding memory cell MC may be read by applying a preset signal between the word lines WL1, WL2, WL3, and WL4 and the bit lines BL1, BL2, BL3, and BL4 to program the memory cell MC and measure a current value through the bit lines BL1, BL2, BL3, and BL4.

Figure 2:
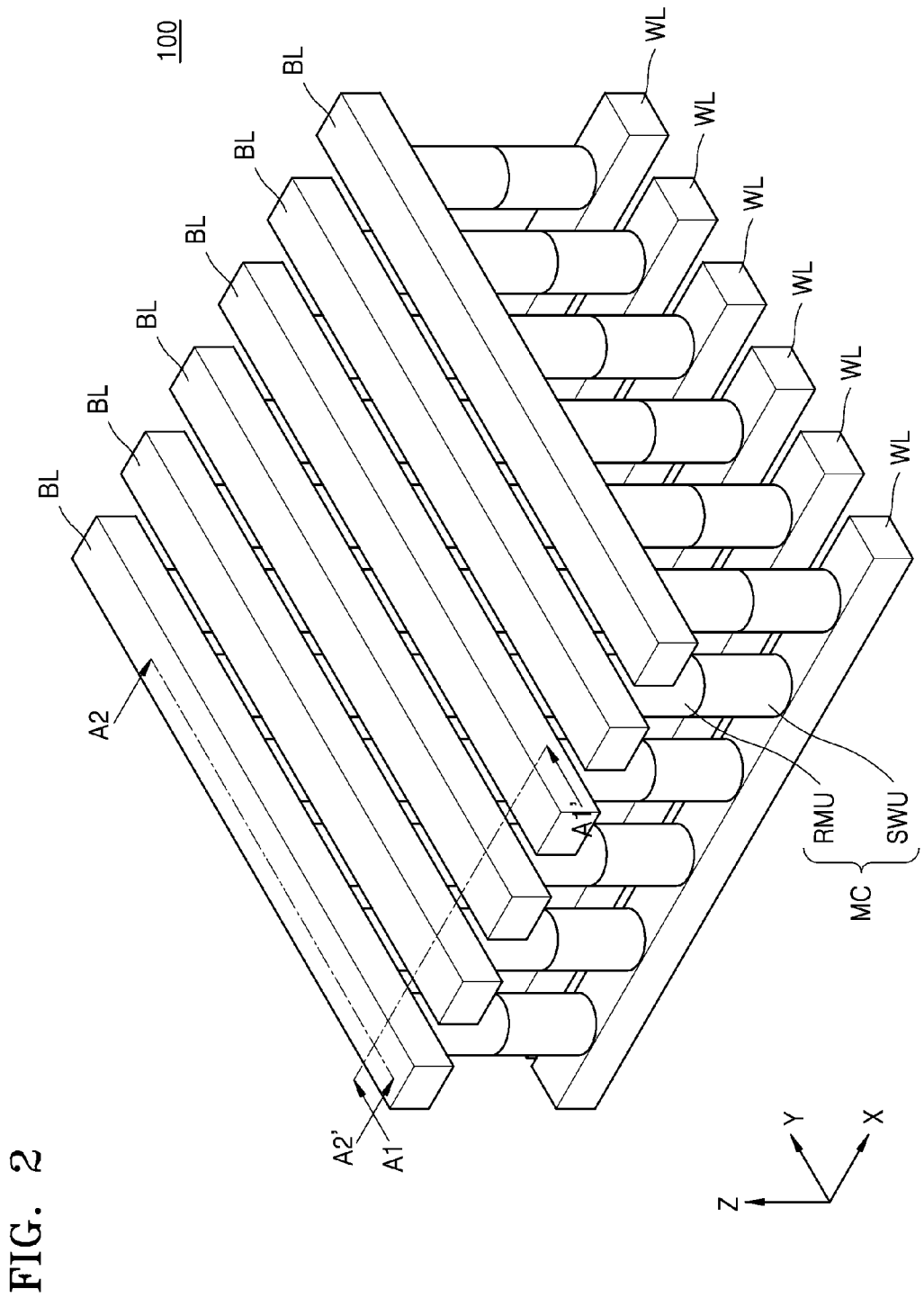
FIG. 2 is a perspective view illustrating a schematic structure of a memory device according to example embodiments.
Figure 3:
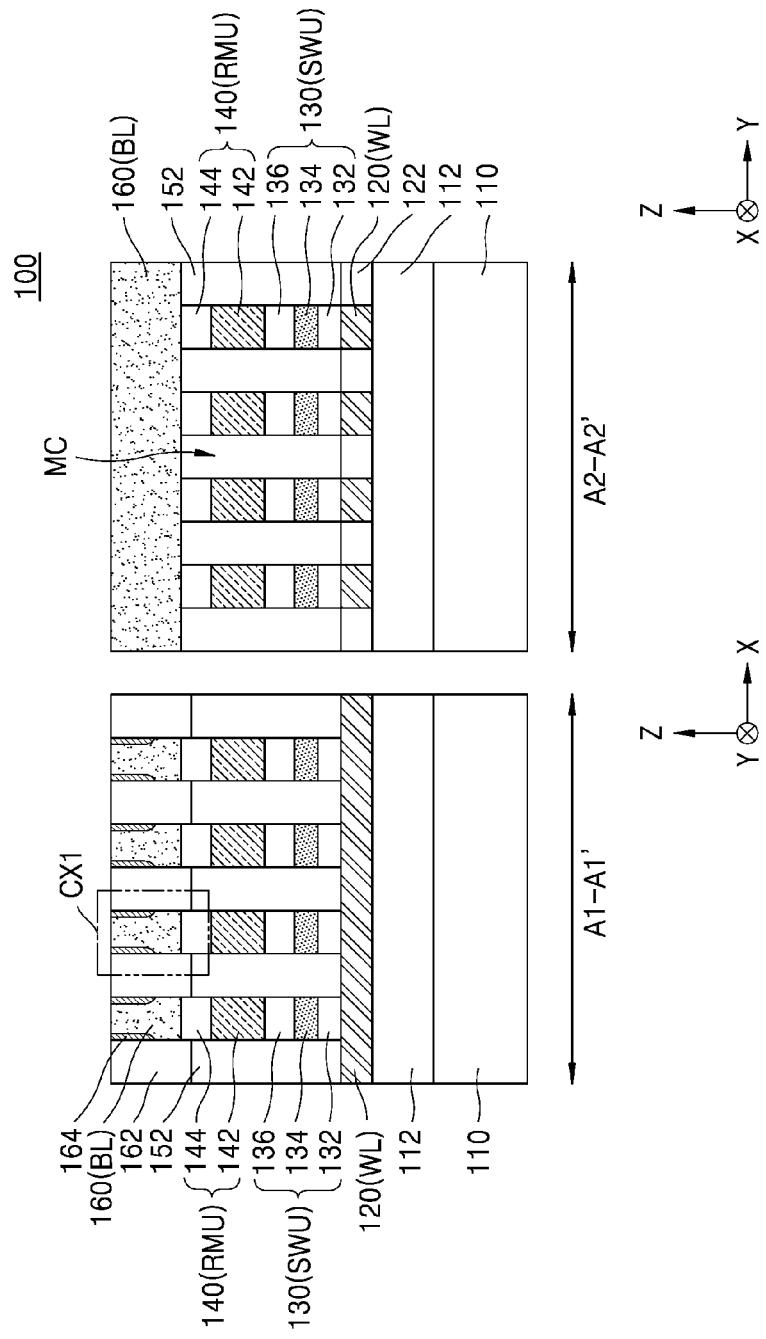
FIG. 3 illustrates cross-sectional views taken along lines A1-A1' and A2-A2' of FIG. 2.
Figure 4:
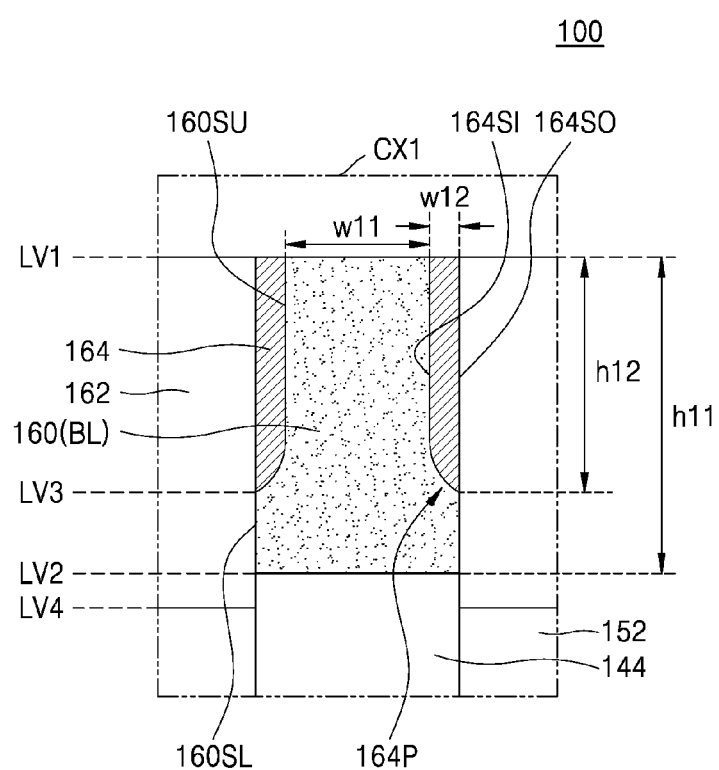
FIG. 4 is an enlarged view of region CX1 of FIG. 3.

FIG. 2 is a perspective view illustrating a schematic structure of a memory device 100 according to example embodiments, and FIG. 3 illustrates cross-sectional views taken along lines A1-A1' and A2-A2' of FIG. 2. FIG. 4 is an enlarged view of region CX1 of FIG. 3.

Referring to FIGS. 2 through 4, a substrate 110 may include a memory cell area and a peripheral circuit area, and a plurality of memory cells MC may be arranged on the memory cell area.

On the peripheral circuit area, a plurality of transistors constituting a driving circuit for driving the plurality of memory cells MC may be formed on the substrate 110. In an implementation, the driving circuit may be peripheral circuits capable of processing data input to/output from the plurality of memory cells MC, e.g., the peripheral circuits may be a page buffer, a latch circuit, a cache circuit, a column decoder, a sense amplifier, a data in/out circuit, a row decoder, or the like. The peripheral circuit area may be arranged on or at one side of the memory cell area or may be arranged at a vertical level different from the memory cell area to vertically overlap at least a portion of the memory cell area.

A lower insulating layer 112 may be on the substrate 110. The lower insulating layer 112 may include an insulation material such as silicon oxide, silicon nitride, silicon oxynitride, or the like. In an implementation, the lower insulating layer 112 may cover at least a portion of the driving circuit on the substrate 110.

A plurality of first conductive lines 120 extending in a first direction (X direction) may be on the lower insulating layer 112. A plurality of second conductive lines 160 may extend in a second direction (Y direction) at a vertical level higher than (e.g., at a distance from the substrate 110 in a vertical direction (Z direction) greater than) the plurality of first conductive lines 120. The plurality of first conductive lines 120 may be spaced apart from each other in the second direction (the Y direction) to respectively extend (e.g., lengthwise) in the first direction (the X direction), and the plurality of second conductive lines 160 may be spaced apart from each other in the first direction (the X direction) to respectively extend (e.g., lengthwise) in the second direction (Y direction). The plurality of first conductive lines 120 may correspond to a plurality of word lines WL, e.g., corresponding to the plurality of word lines WL1, WL2, WL3, and WL4 (refer to FIG. 1), and the plurality of second conductive lines 160 may correspond to a plurality of bit lines BL, e.g., corresponding to the plurality of bit lines BL1, BL2, BL3, and BL4 (refer to FIG. 1). As used herein, the terms "first", "second", and the like are arbitrary designations, and are not to be interpreted as permanently designating a specific element nor requiring sequential inclusion of the elements.

The plurality of first conductive lines 120 and the plurality of second conductive lines 160 may be respectively formed of a metal, a conductive metal nitride, a conductive metal oxide, or a combination thereof. In an implementation, the plurality of first conductive lines 120 and the plurality of second conductive lines 160 may be respectively formed of W, WN, Au, Ag, Cu, Al, TiAlN, Ir, Pt, Pd, Ru, Zr, Rh, Ni, Co, Cr, Sn, Zn, ITO, an alloy thereof, or a combination thereof. In an implementation, one of the plurality of first conductive lines 120 and the plurality of second conductive lines 160 may include a metal layer and a conductive barrier layer covering at least a portion of the metal layer. The conductive barrier layer may be formed of, e.g., Ti, TiN, Ta, TaN, or a combination thereof. As used herein, the term "or" is not an exclusive term, e.g., "A or B" would include A, B, or A and B.

The plurality of memory cells MC may be between the plurality of first conductive lines 120 and the plurality of second conductive lines 160. In an implementation, in a plan view, the plurality of memory cells MC may be arranged in positions where the plurality of first conductive lines 120 cross the plurality of second conductive lines 160. Each of the plurality of memory cells MC may include a variable resistance memory unit 140 for storing information and a switching unit 130 for selecting the memory cell MC.

Each of the plurality of memory cells MC may include the switching unit 130 and the variable resistance memory unit 140 that are sequentially arranged on each of the plurality of first conductive lines 120. The switching unit 130 may include a first electrode 132, a switching material layer 134, and a second electrode 136, and the variable resistance memory unit 140 may include a variable resistance material layer 142 and a third electrode 144. In an implementation, the variable resistance memory unit 140 may further include a heating electrode between the second electrode 136 and the variable resistance material layer 142.

In an implementation, differently from that shown in FIG. 3, the variable resistance memory units 140 and the switching units 130 may be sequentially arranged on the plurality of first conductive lines 120. In an implementation, the variable resistance memory units 140 may be arranged at a level lower than the switching units 130 on the basis of a top surface of the substrate 110 (e.g., closer to the substrate 110 in the Z direction). In this case, the heating electrodes may be further arranged between the variable resistance memory units 140 and the plurality of first conductive lines 120.

A first insulating layer 122 (that fills spaces between adjacent ones among the plurality of first conductive lines 120) may be on the lower insulating layer 112, and a second insulating layer 152 may surround sidewalls of the plurality of memory cells MC. A third insulating layer 162 (that fills spaces between adjacent ones among the plurality of second conductive lines 160) may be on the second insulating layer 152.

In an implementation, the first insulating layer 122, the second insulating layer 152, and the third insulating layer 162 may include an insulation material, e.g., silicon oxide, silicon nitride, silicon oxynitride, or the like. In an implementation, at least one of the first insulating layer 122, the second insulating layer 152, and the third insulating layer 162 may include an air space and an insulating material layer enclosing the air space.

A pair of capping liners 164 may be on sidewalls of each of the plurality of second conductive lines 160. The pair of capping liners 164 may be arranged on upper sidewalls 160SU (e.g., sidewalls distal to the substrate 110 in the Z direction) of each of the plurality of second conductive lines 160, and the pair of capping liners 164 may not cover lower sidewalls 160SL (e.g., sidewalls proximate to the substrate 110 in the Z direction) of each of the plurality of second conductive lines 160. The pair of capping liners 164 may be between the upper sidewalls 160SU of each of the plurality of second conductive lines 160 and the third insulating layer 162, and may not be between the lower sidewalls 160SL of each of the plurality of second conductive lines 160 and the third insulating layer 162.

In an implementation, the pair of capping liners 164 may include a material having etch selectivity with respect to the plurality of second conductive lines 160. In an implementation, the pair of capping liners 164 may include a material that may be formed by an atomic layer deposition (ALD) process or a chemical vapor deposition (CVD) process and have a high step coverage. In an implementation, the pair of capping liners 164 may include, e.g., silicon oxide, silicon nitride, silicon carbide, silicon oxycarbide, or silicon.

In an implementation, as illustrated in FIG. 4, top surfaces (e.g., surfaces facing away from the substrate 110 in the Z direction) of the pair of capping liners 164 may be at a same or equal level (e.g., coplanar with or at a same distance from the substrate 110 in the Z direction) as a top surface level LV1 (e.g., a level of surfaces facing away from the substrate 110 in the Z direction) of the plurality of second conductive lines 160. Bottom surfaces (e.g., substrate 110-facing surfaces) of the pair of capping liners 164 may be at a level LV3 that is higher than (e.g., farther from the substrate 110 in the Z direction than) a bottom surface level LV2 (e.g., a level of substrate 110-facing surfaces) of the plurality of second conductive lines 160.

In an implementation, a top surface of the third insulating layer 162 may be at the same level as (e.g., coplanar with) the top surface level LV1 of the plurality of second conductive lines 160, and a bottom surface of the third insulating layer 162 may be at a level LV4 that is lower than (e.g., closer to the substrate 110 in the Z direction than) the bottom surface level LV2 of the plurality of second conductive lines 160. In an implementation, a top surface of the second insulating layer 152 may contact (e.g., directly contact) the bottom surface of the third insulating layer 162 and may be at the level LV4 that is lower than the bottom surface level LV2 of the plurality of second conductive lines 160. This may be because a second conductive layer 160L (refer to FIG. 11) may be overetched to form sidewalls of the plurality of second conductive lines 160 having vertical profiles in a patterning process of the plurality of second conductive lines 160, and thus, a portion of an upper portion of the second insulating layer 152 may be etched by a preset height, thereby lowering a top surface level of the second insulating layer 152.

In an implementation, the plurality of second conductive lines 160 may have a first height h11 in the vertical direction (Z direction), and the pair of capping liners 164 may have a second height h12 that is less or shorter than the first height h11 in the vertical direction (the Z direction). In an implementation, the first height h11 may be, e.g., about 30 nm to about 150 nm. In an implementation, the second height h12 of the pair of capping liners 164 may be, e.g., about 40% to about 90% of the first height h11.

In an implementation, the plurality of second conductive lines 160 may have a first width w11 in the first direction (the X direction), and a ratio of the first height h11 to the first width w11 may be about 0.5 to about 5. In an implementation, the pair of capping liners 164 may have a first thickness w12 of, e.g., about 1 nm to about 4 nm in the first direction (the X direction).

Outer sidewalls 164SO of the pair of capping liners 164 may contact (e.g., directly contact) the third insulating layer 162, and inner sidewalls 164SI of the pair of capping liners 164 may contact (e.g., directly contact) upper sidewalls 160SU of each of the plurality of second conductive lines 160. The outer sidewalls 164SO of the pair of capping liners 164 may be aligned with lower sidewalls 160SL of each of the plurality of second conductive lines 160 (e.g., to form a flat or continuous surface). In an implementation, the outer sidewalls 164SO of the pair of capping liners 164 and the lower sidewalls 160SL of each of the plurality of second conductive lines 160 may be arranged on a straight line or may be coplanar with each other. In an implementation, an upper portion of the third insulating layer 162 may cover the outer sidewalls 164SO of the pair of capping liners 164, and a lower portion of the third insulating layer 162 may cover the lower sidewalls 160SL of the plurality of second conductive lines 160.

In a manufacturing process according to an embodiment, a portion of the second conductive layer 160L (refer to FIG. 12) may be etched, the pair of capping liners 164 may be formed on sidewalls 160LH of the second conductive layer 160L formed by the etching, and a remaining thickness of the second conductive layer 160L may be etched again. Through the manufacturing process described above, the upper sidewalls 160SU of the plurality of second conductive lines 160 may first be formed, the pair of capping liners 164 may be formed on the upper sidewalls 160SU, and the lower sidewalls 160SL of the plurality of second conductive lines 160 may be formed by using the pair of capping liners 164 as etching masks.

As illustrated in FIG. 4, the pair of capping liners 164 may include tapered portions 164P at bottom portions thereof (e.g., portions proximate to the substrate 110 in the Z direction). Portions of the upper sidewalls 160SU of the plurality of second conductive lines 160 contacting the tapered portions 164P may protrude outwards (e.g., along or complementary to the shape of the tapered portions 164P). In an implementation, in a process of etching a portion of the second conductive layer 160L (refer to FIG. 12), the sidewalls 160LH (refer to FIG. 12) and a bottom portion 160LB (refer to FIG. 12) of the second conductive layer 160L may be etched in rounded shapes, and a portion of a capping liner layer 164L (refer to FIG. 13) arranged on the bottom portion 160LB may be removed together with the second conductive layer 160L, thereby forming the tapered portions 164P on bottom portions of the capping liners 164 remaining on the sidewalls 160LH of the second conductive layer 160L.

Figure 6:
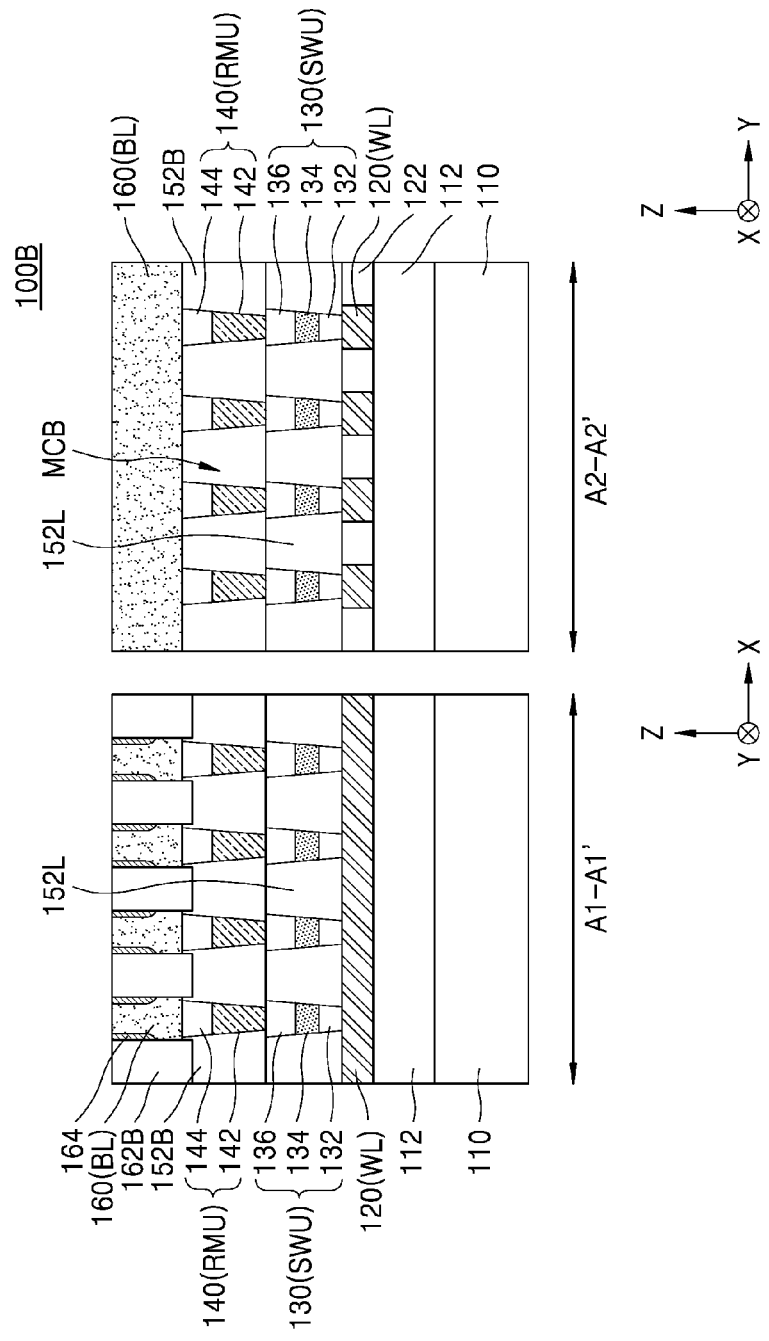
FIG. 6 is a cross-sectional view illustrating a memory device according to example embodiments.

In an implementation, the third insulating layer 162 may fill spaces between adjacent ones among the plurality of second conductive lines 160 and may have a bottom (e.g., substrate 110-facing) surface that is at a level lower than (e.g., closer to the substrate 110 in the third direction than) bottom surfaces of the plurality of second conductive lines 160. In an implementation, as shown in FIG. 4, when a width of the bottom surfaces of the plurality of second conductive lines 160 is substantially the same as a width of a top surface of the third electrode 144, the third insulating layer 162 may surround portions of sidewalls of the third electrode 144. In an implementation, as shown in FIG. 6, the width of the top surface of the third electrode 144 may be narrower or smaller than the width of the bottom surfaces of the plurality of second conductive lines 160. In this case, the sidewalls of the third electrode 144 may be surrounded by the second insulting layer 152, and the third electrode 144 may not directly contact the third insulating layer 162.

The switching unit 130 may include the first electrode 132, the switching material layer 134, and the second electrode 136. The switching material layer 134 may be a current adjustment layer capable of controlling a flow of current. The switching material layer 134 may include a material layer having resistance that may vary according to the magnitude of a voltage across both ends of the switching material layer 134, e.g., the switching material layer 134 may include a material layer having an ovonic threshold switching (OTS) characteristic. When a voltage less than a threshold voltage is applied to the switching material layer 134, the switching material layer 134 maintains a high resistance state in which little current flows, and when a voltage greater than the threshold voltage is applied to the switching material layer 134, the switching material layer 134 is changed into a low resistance state and current starts flowing. In an implementation, when current flowing through the switching material layer 134 becomes less than holding current, the switching material layer 134 may be changed into a high resistance state.

The switching material layer 134 may include a chalcogenide material as an OTS material layer. In an implementation, the switching material layer 134 may include, e.g., silicon (Si), tellurium (Te), arsenic (As), germanium (Ge), indium (In), or a combination thereof. In an implementation, the switching material layer 134 may include silicon (Si) of about 14% concentration, tellurium (Te) of about 39% concentration, arsenic (As) of about 37% concentration, germanium (Ge) of about 9% concentration, or indium (In) of about 1% concentration. Here, a percentage ratio is an atomic percentage ratio with an atomic component totaling 100% and is the same below. In an implementation, the switching material layer 134 may include silicon (Si), tellurium (Te), arsenic (As), germanium (Ge), sulfur (S), selenium (Se), or a combination thereof. In an implementation, the switching material layer 134 may include silicon (Si) of about 5% concentration, tellurium (Te) of about 34% concentration, arsenic (As) of about 28% concentration, germanium (Ge) of about 11% concentration, sulfur (S) of about 21% concentration, or selenium (Se) of about 1% concentration. In an implementation, the switching material layer 134 may include silicon (Si), tellurium (Te), arsenic (As), germanium (Ge), sulfur (S), selenium (Se), antimony (Sb), or a combination thereof. In an implementation, the switching material layer 134 may include tellurium (Te) of about 21% concentration, arsenic of about 10% concentration, germanium (Ge) of about 15% concentration, sulfur (S) of about 2% concentration, selenium (Se) of about 50% concentration, or antimony (Sb) of about 2% concentration.

In an implementation, the switching material layer 134 may include various types of material layers capable of selecting elements. In an implementation, the switching material layer 134 may include, e.g., a diode, a tunnel junction, a PNP diode, or a bipolar junction transistor (BJT), mixed ionic-electronic conduction (MIEC), or the like.

The first electrode 132 and the second electrode 136 may be layers serving as current paths and may be formed of a conductive material. In an implementation, each of the first electrode 132 and the second electrode 136 may be formed of a metal, a conductive metal nitride, a conductive metal oxide, or a combination thereof. In an implementation, each of the first electrode 132 and the second electrode 136 may include, e.g., a TiN layer.

The variable resistance memory unit 140 may include the variable resistance material layer 142 and the third electrode 144. In an implementation, the variable resistance material layer 142 may include a phase change material that reversibly changes between an amorphous state and a crystalline state according to heat (e.g., a heating time). In an implementation, the variable resistance material layer 142 may include a material having a phase that may be reversibly changed by Joule heat generated by a voltage applied to both ends of the variable resistance material layer 142 and having resistance that may be changed due to this phase change. In an implementation, the phase change material may be in a high resistance state in an amorphous phase and may be in a low resistance state in a crystalline phase. The high resistance state may be defined as "0," and the low resistance state may be defined as "1" to store data in the variable resistance material layer 142.

In an implementation, the variable resistance material layer 142 may include one or more elements (chalcogen element) from Group VI of the periodic table and selectively one or more chemical modifiers from Group III, IV, or V. In an implementation, the variable resistance material layer 142 may include, e.g., $Ge_2Sb_2Te_5$, $Ge_2Sb_2Te_7$, $Ge_1Sb_2Te_4$, $Ge_1Sb_4Te_7$, or the like. In an implementation, the variable resistance material layer 142 may include, e.g., Ge—Te, Sb—Te, In—Se, Ga—Sb, In—Sb, As—Te, Al—Te, Bi—Sb—Te, In—Sb—Te, Ge—Sb—Te, Te—Ge—As, Te—Sn—Se, Ge—Se—Ga, Bi—Se—Sb, Ga—Se—Te, Sn—Sb—Te, In—Sb—Ge, In—Ge—Te, Ge—Sn—Te, Ge—Bi—Te, Ge—Te—Se, As—Sb—Te, Sn—Sb—Bi, Ge—Te—O, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, In—Sn—Sb—Te, As—Ge—Sb—Te, or a combination thereof.

Each element forming the variable resistance material layer 142 may have various stoichiometry. Crystallization temperature, melting temperature, phase change rate according to crystallization energy, and data retention characteristics of the variable resistance material layer 142 may be adjusted according to the chemical stoichiometry of each element. In an implementation, the variable resistance material layer 142 may further include an impurity, e.g., carbon (C), nitrogen (N), oxygen (O), bismuth (Bi), or tin (Sn). In an implementation, the variable resistance material layer 142 may further include a metal material, e.g., aluminum (Al), gallium (Ga), zinc (Zn), titanium (Ti), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), lead (Pb), or polonium (Po).

The variable resistance material layer 142 may have a multilayer structure in which two or more layers having different physical properties are stacked. A barrier layer that prevents material diffusion between a plurality of layers may be further arranged between the plurality of layers. In an implementation, the variable resistance material layer 142 may have a superlattice structure in which a plurality of layers including different types of materials are alternately stacked. In an implementation, the variable resistance material layer 142 may have a structure in which a first layer formed of Ge—Te and a second layer formed of Sb—Te are alternately stacked. In an implementation, the first layer and the second layer may each include various types of materials as described above.

In an implementation, the phase change material may be the variable resistance material layer 142. In an implementation, the variable resistance material layer 142 may include various types of materials having resistance change characteristics.

In an implementation, when the variable resistance material layer 142 includes a transition metal oxide, the memory device 100 may be a resistive random access memory (ReRAM). At least one electrical path may be generated or extinguished in the variable resistance material layer 142 including the transition metal oxide by a program operation. When the electrical path is generated, the variable resistance material layer 142 may have a low resistance value, and when the electrical path is eliminated, the variable resistance material layer 142 may have a high resistance value. The memory device 100 may store data by using a difference between resistance values of the variable resistance material layer 142 as described above.

When the variable resistance material layer 142 is formed of the transition metal oxide, the transition metal oxide may include a metal, e.g., Ta, Zr, Ti, Hf, Mn, Y, Ni, Co, Zn, Nb, Cu, Fe, or Cr. In an implementation, the transition metal oxide may be formed of a single layer or a multilayer formed of, e.g., $Ta_2O_{5-x}$, $ZrO_{2-x}$, $HfO_{2-x}$, $MnO_{2-x}$, $Y_2O_{3-x}$, $NiO_{1-y}$, $Nb_2O_{5-x}$, $CuO_{1-y}$, or $Fe_2O_{3-x}$. In an implementation, in the materials illustrated above, x and y may be selected within a range of $0 \leq x \leq 1.5$ and $0 \leq y \leq 0.5$, respectively.

In an implementation, when the variable resistance material layer 142 has a magnetic tunnel junction (MTJ) structure including two electrodes formed of a magnetic material and a dielectric between the two magnetic material electrodes, the memory device 100 may be magnetic random access memory (MRAM).

The two electrodes may be a magnetized fixed layer and a magnetized free layer, respectively, and the dielectric therebetween may be a tunnel barrier layer. The magnetized fixed layer may have a magnetization direction fixed in one direction, and the magnetized free layer may have a magnetization direction that may be changed to be parallel or anti-parallel to the magnetization direction of the magnetized fixed layer. In an implementation, the magnetization directions of the magnetized fixed layer and the magnetized free layer may be parallel to one surface of the tunnel barrier layer. The magnetization directions of the magnetized fixed layer and the magnetized free layer may be perpendicular to the one surface of the tunnel barrier layer.

When the magnetization direction of the magnetized free layer is parallel to the magnetization direction of the magnetized fixed layer, the variable resistance material layer 142 may have a first resistance value. When the magnetization direction of the magnetized free layer is anti-parallel to the magnetization direction of the magnetized fixed layer, the variable resistance material layer 142 may have a second resistance value that is different from the first resistance value. The memory device 100 may store data by using a difference between resistance values as described above. The magnetization direction of the magnetized free layer may be changed by spin torque of electrons in program current.

The magnetized fixed layer and the magnetized free layer may include a magnetic material. In an implementation, the magnetized fixed layer may further include an antiferromagnetic material that fixes a magnetization direction of a ferromagnetic material included in the magnetized fixed layer. In an implementation, the tunnel barrier layer may be formed of an oxide of, e.g., Mg, Ti, Al, MgZn, or MgB.

The third electrode 144 may be a layer serving as a current path and may be formed of a conductive material. In an implementation, the third electrode 144 may be formed of metal, conductive metal nitride, conductive metal oxide, or a combination thereof. In an implementation, the third electrode 144 may include a conductive material capable of generating enough heat to change phases of the variable resistance material layer 142. In an implementation, the third electrode 144 may be formed of a high melting point metal-containing material, a nitride thereof, or a carbon-based conductive material, e.g. TiN, TiSiN, TiAlN, TaSiN, TaAlN, TaN, WSi, WN, TiW, MoN, NbN, TiBN, ZrSiN, WSiN, WBN, ZrAlN, MOAlN, TiAl, TiON, TiAlON, WON, TaON, C, SiC, SiCN, CN, TiCN, TaCN, or a combination thereof. In an implementation, the third electrode 144 may include a conductive layer formed of a metal, a conductive metal nitride, or a conductive metal oxide and at least one conductive barrier layer covering at least a portion of the conductive layer. In an implementation, the conductive barrier layer may be formed of a metal oxide, a metal nitride, or a combination thereof.

In some cross-point type of memory devices, a plurality of memory cells may be formed at cross-points between a plurality of bit lines and a plurality of word lines. In a process of etching a second conductive layer to form a plurality of bit lines, if the second conductive layer were to be not fully etched, tail portions may be formed at bottom portions of the bit lines or etch residues may be attached to the bottom portions of the bit lines, thereby reducing gaps among the bit lines. As the etch residues are attached to the bottom portions of the bit lines, an electrical short circuit could occur between adjacent cells or when memory cells are patterned after patterning the bit lines, an etch rate of the memory cells may be reduced due to reductions in gaps between the bit lines. Also, if the second conductive layer were to be overetched to prevent the tail portions from occurring as described above, sidewall portions of the bit lines may be unintentionally etched or eroded rather than a material exposed under the bit lines is etched, thereby producing bowing of the second conductive layer. In this case, recesses may be formed in sidewalls of the bit lines, and bit line resistance may increase due to reduced volumes of the bit lines.

In the memory device 100 according to an embodiment, etching may be stopped before fully etching the second conductive layer 160L, the pair of capping liners 164 may be formed on the sidewalls 160LH of the second conductive layer 160L, and the second conductive layer 160L may be overetched to form the plurality of second conductive lines 160. Therefore, while overetching the second conductive layer 160L, the pair of capping liners 164 may serve as protection layers that prevent etching or erosion of the sidewalls 160LH of the second conductive layer 160L. Therefore, undesirable erosion, bowing, or recess formation of the sidewalls of the plurality of second conductive lines 160 may be reduced or prevented, and the sidewalls of the plurality of second conductive lines 160 may have vertical or relatively flat profiles. As a result, an etch rate reduction in a subsequent patterning process of memory cells may be reduced or prevented, and the plurality of second conductive lines 160 may have relatively low resistance. Accordingly, the memory device 100 may have high reliability.

Figure 5:
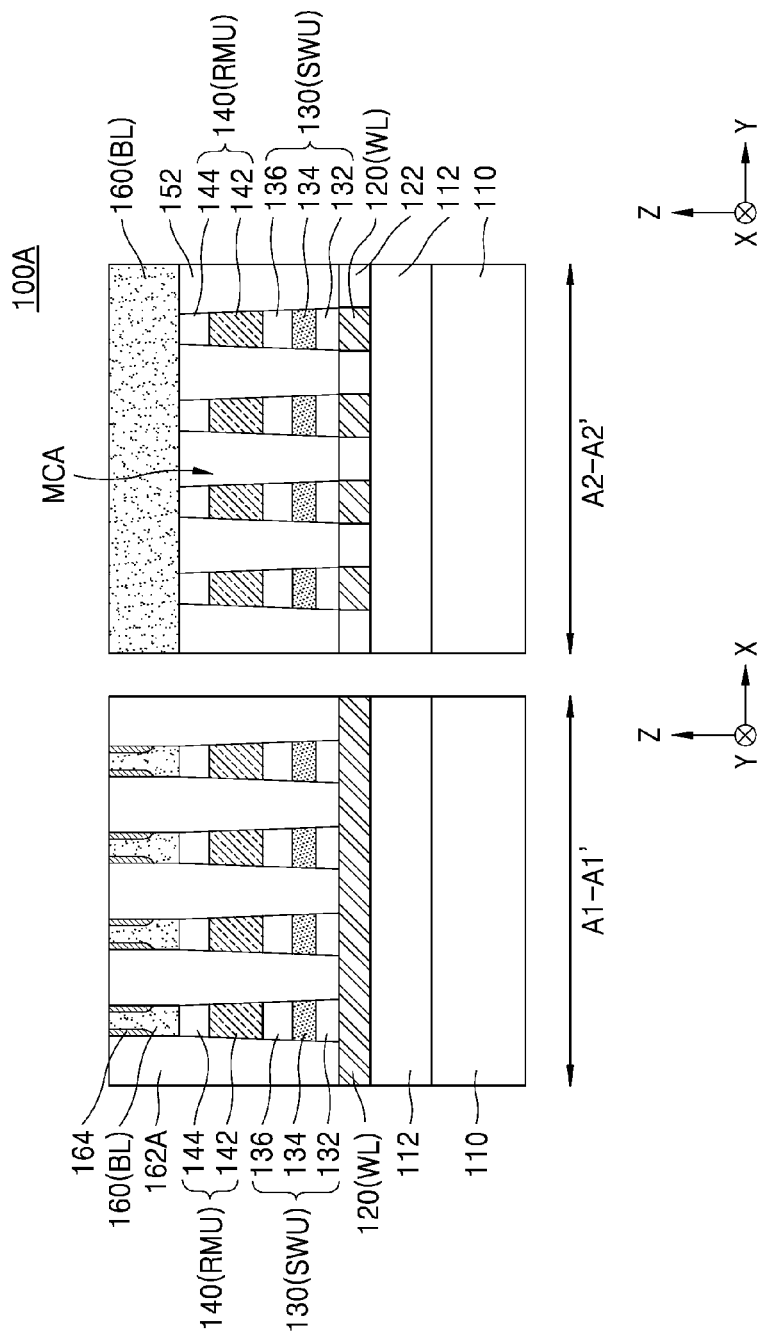
FIG. 5 is a cross-sectional view illustrating a memory device according to example embodiments.

FIG. 5 is a cross-sectional view illustrating a memory device 100A according to example embodiments. FIG. 5 is a cross-sectional view of portions corresponding to lines A1-A1' and A2-A2' of FIG. 2. The same reference numerals in FIG. 5 as those in FIGS. 1 through 4 denote the same elements.

Referring to FIG. 5, a pair of capping liners 164, lower sidewalls of each of a plurality of second conductive lines 160, and sidewalls of each of a plurality of memory cells MCA may be arranged on a straight line. The lower sidewalls of the plurality of second conductive lines 160 may be continuously connected to the sidewalls of the plurality of memory cells MCA without kinks or step differences.

In an implementation, the pair of capping liners 164, the lower sidewalls of each of the plurality of second conductive lines 160, and the sidewalls of each of the plurality of memory cells MCA may be inclined at a preset inclination angle. In an implementation, the pair of capping liners 164 and the lower sidewalls of the plurality of second conductive lines 160 may be substantially vertical, and the sidewalls of the plurality of memory cells MCA may be inclined at a preset inclination angle. In an implementation, a width of the plurality of memory cells MCA may increase downwards so that a width (e.g., in the X direction) of bottom surfaces thereof is greater than a width of top surfaces thereof. In an implementation, both sidewalls of the plurality of second conductive lines 160 and the sidewalls of the plurality of memory cells MCA may be covered by a third insulating layer 162A.

In an implementation, the third insulating layer 162A may have a top surface that is at the same level as (e.g., the same distance from the substrate 110 in the Z direction or coplanar with) top surfaces of the plurality of second conductive lines 160 and may have a bottom surface on top surfaces of a plurality of first conductive lines 120. Two sidewalls of each of the plurality of memory cells MCA spaced apart from each other in a second direction (Y direction) may be covered by a second insulating layer 152, and two sidewalls of each of the plurality of memory cells MCA spaced apart from each other in a first direction (X direction) may be covered by the third insulating layer 162A.

In a manufacturing process according to an embodiment, a memory cell stack MCS (refer to FIG. 18) may be patterned by using a line-shaped mask pattern as an etch mask to form memory cell patterns MCP (refer to FIG. 19), a portion of a second conductive layer 160L on the memory cell patterns MCP may be etched, the capping liners 164 may be formed, and the second conductive layer 160L may be etched again to form the plurality of second conductive lines 160. Thereafter, portions of the memory cell patterns MCP exposed through spaces among the plurality of second conductive lines 160 may be etched to form the plurality of memory cells MCA. The third insulating layer 162A that fills spaces between adjacent ones among the plurality of second conductive lines 160 and the plurality of memory cells MCA may be formed.

In some manufacturing processes of a cross-point type of memory device, the memory cell stack MCS may be patterned by a line-shaped mask extending in the first direction (the X direction) to first form the memory cell patterns MCP, the second conductive layer 160L may be patterned by using a line-shaped mask extending in a second direction (Y direction) to form bit lines, and then the memory cell patterns MCP may be patterned to form the memory cells MCA. When the second conductive layer 160L is not fully etched, tail portions may be formed at bottom portions of the bit lines or etch residues may be attached to the bottom portions of the bit lines, thereby reducing gaps between the bit lines. An etch rate of the memory cell patterns MCP may be reduced by the reduction in the gaps between the bit lines. The second conductive layer 160L could be overetched to prevent the tail portions from occurring. However, in the overetching process, an etchant for etching the second conductive layer 160L may unintentionally etch sidewall portions of the second conductive layer 160L rather than etching a material (e.g., a carbon-based electrode material forming a third electrode 144) exposed under the second conductive layer 160L, and thus, bowing of the second conductive layer 160L could occur. In this case, recesses may be formed in sidewalls of the bit lines, and bit line resistance may increase due to reduced volumes of the bit lines.

However, in the memory device 100A according to an embodiment described above, etching may be stopped before fully etching the second conductive layer 160L, the capping liners 164 may be formed on sidewalls 160LH and a bottom portion 160LB of the second conductive layer 160L, and then the second conductive layer 160L may be overetched to form the plurality of second conductive lines 160. Therefore, while overetching the second conductive layer 160L, the pair of capping liners 164 may serve as protection layers that prevent etching or erosion of the sidewalls 160LH of the second conductive layer 160L. As a result, undesirable erosion, bowing, or recess formation of the sidewalls of the plurality of second conductive lines 160 may be reduced or prevented, and the sidewalls of the plurality of second conductive lines 160 may have vertical or relatively flat profiles. Accordingly, the reduction in the etch rate in the patterning process of the memory cell patterns MCP may be reduced or prevented, and the plurality of second conductive lines 160 may have relatively low resistance. Therefore, the memory device 100A may have high reliability.

FIG. 6 is a cross-sectional view illustrating a memory device 100B according to example embodiments. FIG. 6 is cross-sectional view of portions corresponding to lines A1-A1' and A2-A2' of FIG. 2. The same reference numerals in FIG. 6 as those in FIGS. 1 through 5 denote the same elements.

Referring to FIG. 6, each of a plurality of memory cells MCB may include a switching unit 130 and a variable resistance memory unit 140 that are formed in a damascene method. For example, the switching units 130 may be surrounded by a lower mold layer 152L, and a width of top surfaces of the switching units 130 may be slightly greater than a width of bottom surfaces of the switching units 130. Also, the variable resistance memory units 140 may be surrounded by an upper mold layer 152B, and a width of top surfaces of the variable resistance memory units 140 may be slightly greater than a width of bottom surfaces of the variable resistance memory units 140.

In a manufacturing process according to an embodiment, the lower mold layer 152L having a plurality of holes may be formed, first electrodes 132, switching material layers 134, and second electrodes 136 may be sequentially filled in the lower mold layer 152L, and unneeded material layers remaining on a top surface of the lower mold layer 152L may be removed by a chemical mechanical polishing (CMP) process or the like to form the switching units 130. Similarly, the upper mold layer 152B having a plurality of holes may be formed, variable resistance material layers 142 and third electrodes 144 may be sequentially filled in the upper mold layer 152B, and unneeded material layers remaining on a top surface of the upper mold layer 152B may be removed by a CMP process or the like to form the variable resistance memory units 140.

A third insulating layer 162B may have a bottom surface that is at a level lower than bottom surfaces of a plurality of second conductive lines 160, and the bottom surface and lower sidewalls of the third insulating layer 162B may be surrounded by the upper mold layer 152B. This may be because overetching of a second conductive layer 160L (refer to FIG. 11) may be performed to form vertical sidewall profiles of the plurality of second conductive lines 160 in a patterning process of the plurality of second conductive lines 160, and thus, an upper portion of the upper mold layer 152B may be removed together by a preset height, and the third insulating layer 162B may be filled in this space.

In an implementation, the width (in the X direction) of the top surfaces (e.g., surfaces facing away from the substrate 110 in the Z direction) of the variable resistance memory units 140 may be less than a width (in the X direction) of the bottom surfaces of the plurality of second conductive lines 160, and the top surfaces of the variable resistance memory units 140 may be fully covered by the plurality of second conductive lines 160. In an implementation, the variable resistance memory units 140 may not contact the third insulating layer 162B. As a result, in an overetching process of the second conductive layer 160L (refer to FIG. 11), the top surfaces or sidewalls of the variable resistance memory units 140 may be covered by the upper mold layer 152B and not exposed to an etching atmosphere, and thus, damage or deterioration of the variable resistance material layers 142 may be prevented.

Figure 7:
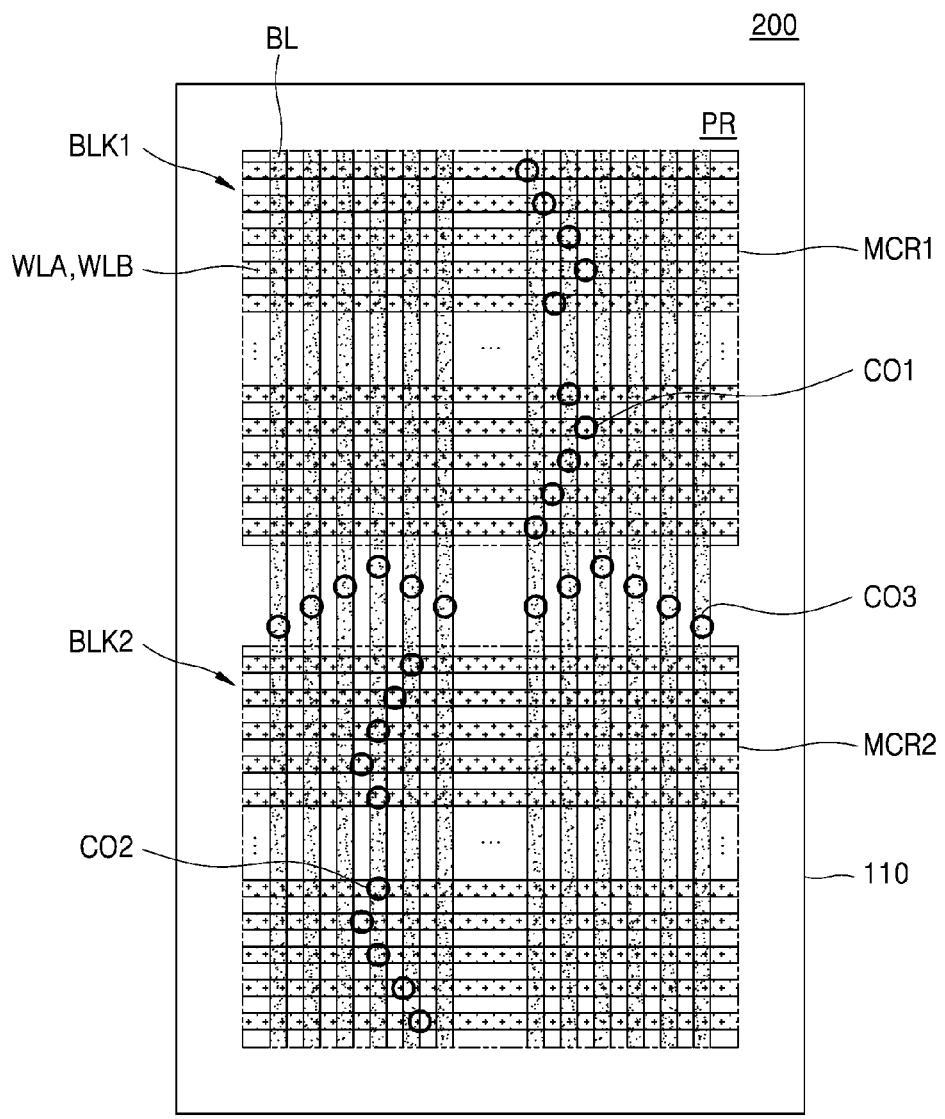
FIG. 7 is a layout diagram illustrating a memory device according to example embodiments.
Figure 7:
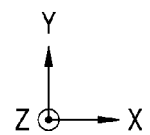
Figure 8:
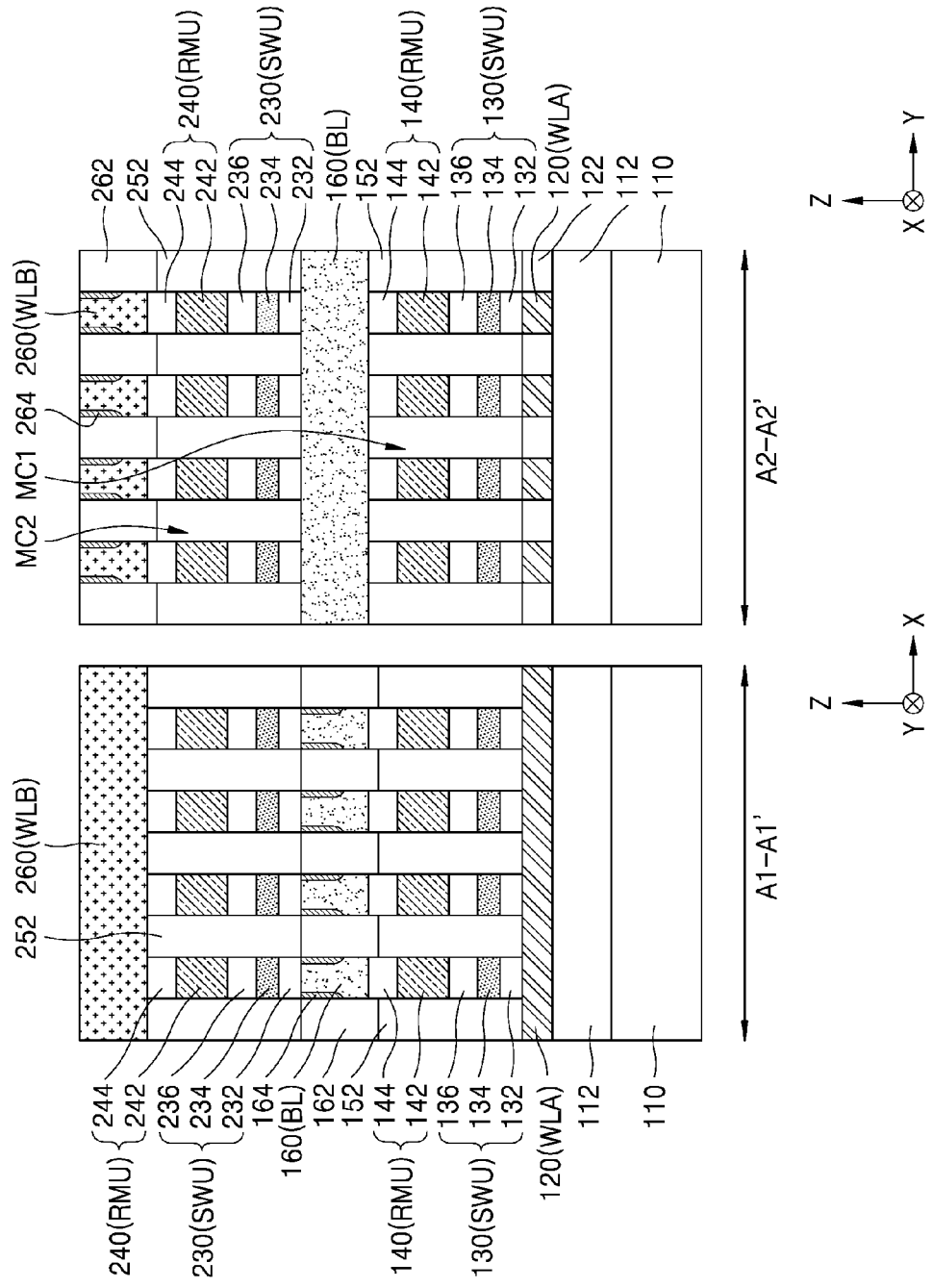
FIG. 8 is a cross-sectional view corresponding to lines A1-A1' and A2-A2' of FIG. 2.

FIG. 7 is a layout diagram illustrating a memory device 200 according to example embodiments. FIG. 8 is a cross-sectional view corresponding to lines A1-A1' and A2-A2' of FIG. 2. The same reference numerals in FIGS. 7 and 8 as those in FIGS. 1 through 6 denote the same elements.

Referring to FIGS. 7 and 8, the memory device 200 may include a first memory cell block BLK1 and a second memory cell block BLK2 on a substrate 110. The substrate 110 may include a first memory cell area MCR1, a second memory cell area MCR2, and a peripheral area PR. The first memory cell block BLK1 may be on the first memory cell area MCR1, and the second memory cell block BLK2 may be on the second memory cell area MCR2. Each of the first memory cell block BLK1 and the second memory cell block BLK2 may include at least one selected from the memory devices 100, 100A, and 100B described with reference to FIGS. 1 through 6.

The memory device 200 may include a plurality of first conductive lines 120 (corresponding to a plurality of first word lines WLA) extending in a first direction (X direction), a plurality of second conductive lines 160 (corresponding to a plurality of bit lines BL) extending in a second direction (Y direction), and a plurality of third conductive lines 260 (corresponding to a plurality of second word lines WLB) extending in the first direction (the X direction).

The plurality of first conductive lines 120 and the plurality of second conductive lines 160 may have similar characteristics to those described with reference to FIGS. 2 through 6. In particular, a pair of capping liners 164 may be arranged on upper sidewalls 160SU (refer to FIG. 4) of each of the plurality of second conductive lines 160.

As shown in FIG. 8, a pair of capping liners 264 may be arranged on both sidewalls of each of the plurality of third conductive lines 260. The pair of capping liners 264 on both sidewalls of each of the plurality of third conductive lines 260 may have similar characteristics to the pair of capping liners 164 on both sidewalls of each of the plurality of second conductive lines 160. In an implementation, the plurality of third conductive lines 260 and the pair of capping liners 264 may be formed by a similar method to a method of forming the plurality of second conductive lines 160 and the pair of capping liners 164.

A plurality of memory cells MC1 may be between the plurality of first conductive lines 120 and the plurality of second conductive lines 160, and a plurality of memory cells MC2 may be between the plurality of second conductive lines 160 and the plurality of third conductive lines 260. The plurality of second conductive lines 160 may serve as common bit lines for both the plurality of memory cells MC1 and the plurality of memory cells MC2.

Each of the plurality of memory cells MC2 may include a switching unit 230 and a variable resistance memory unit 240. The switching unit 230 may include a first electrode 232, a switching material layer 234, and a second electrode 236, and the variable resistance memory unit 240 may include a variable resistance material layer 242 and a third electrode 244. The plurality of memory cells MC1 and the plurality of memory cells MC2 may have similar characteristics to the plurality of memory cells MC described with reference to FIGS. 1 through 4.

Also, the plurality of memory cells MC2 may be surrounded by a fourth insulating layer 252, and spaces between adjacent ones among the plurality of third conductive lines 260 may be filled with a fifth insulating layer 262. The fifth insulating layer 262 may have a bottom surface that is at a level lower than bottom surfaces of the plurality of third conductive lines 260.

As shown in FIG. 7, first contacts CO1 may be on the plurality of third conductive lines 260 of the first memory cell block BLK1, and second contacts CO2 may be on the plurality of third conductive lines 260 of the second memory cell block BLK2. Also, the first memory cell block BLK1 and the second memory cell block BLK2 may share the plurality of second conductive lines 160, and third contacts CO3 may be on the plurality of second conductive lines 160.

In an implementation, as illustrated in FIG. 8, the plurality of second conductive lines 160 may serve as common bit lines for both the plurality of memory cells MC1 and the plurality of memory cells MC2. In an implementation, a plurality of additional conductive lines may be further formed between the plurality of second conductive lines 160 and the plurality of memory cells MC2 to serve as bit lines connected to the plurality of memory cells MC2, and a pair of capping liners may or may not be formed on both sidewalls of each of the plurality of additional conductive lines.

In an implementation, as illustrated in FIG. 8, a two-layer stack in which the plurality of memory cells MC1 and the plurality of memory cells MC2 may be vertically stacked. In an implementation, one memory cell unit or two or more memory cell units including additional word lines, additional memory cells, and additional bit lines may be further formed above the plurality of memory cells MC2.

FIGS. 9 through 17 are cross-sectional views of stages in a method of manufacturing the memory device 100, according to example embodiments.

Figure 9:
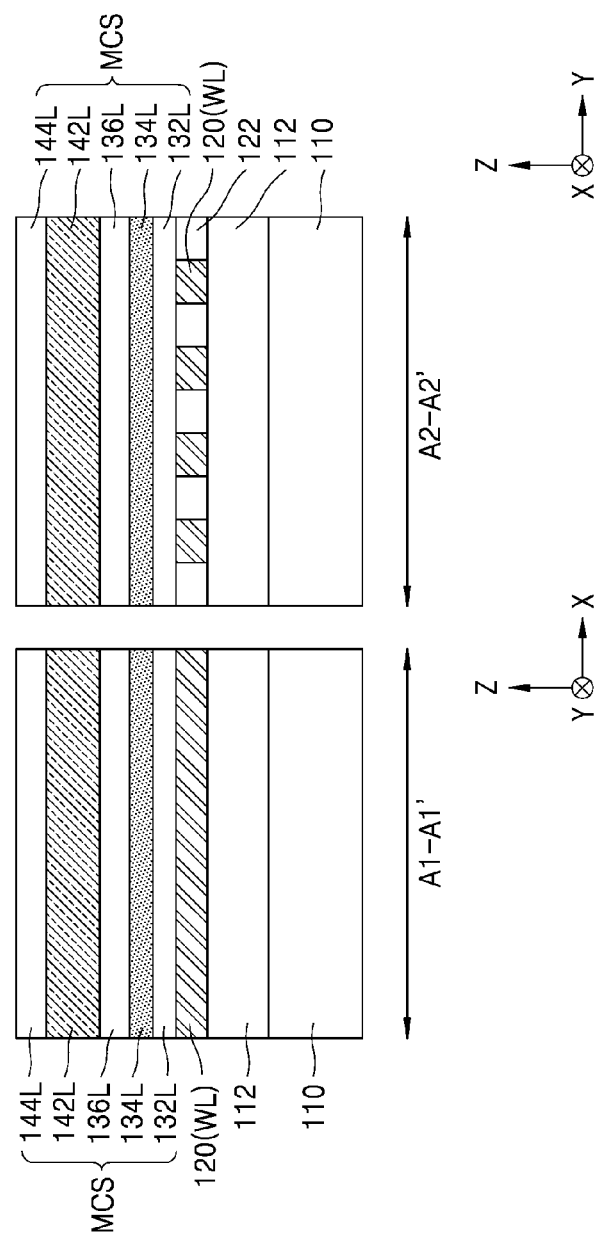
FIGS. 9 through 17 are cross-sectional views of stages in a method of manufacturing a memory device, according to example embodiments.

Referring to FIG. 9, a lower insulating layer 112 may be formed on a substrate 110. A first conductive layer may be formed on the lower insulating layer 112 and patterned to form a plurality of first conductive lines 120. Thereafter, an insulating layer may be formed on the plurality of first conductive lines 120 and the lower insulating layer 112, and an upper portion of the insulating layer may be planarized so that top surfaces of the plurality of first conductive lines 120 are exposed, to form a first insulating layer 122.

In an implementation, a hard mask may be formed by a double patterning method to form the plurality of first conductive lines 120, and the plurality of first conductive lines 120 may be patterned by using the hard mask.

Thereafter, a memory cell stack MCS that sequentially includes a first electrode material layer 132L, a preliminary switching material layer 134L, a second electrode material layer 136L, a preliminary variable resistance material layer 142L, and a third electrode material layer 144L may be formed on the plurality of first conductive lines 120.

Figure 10:
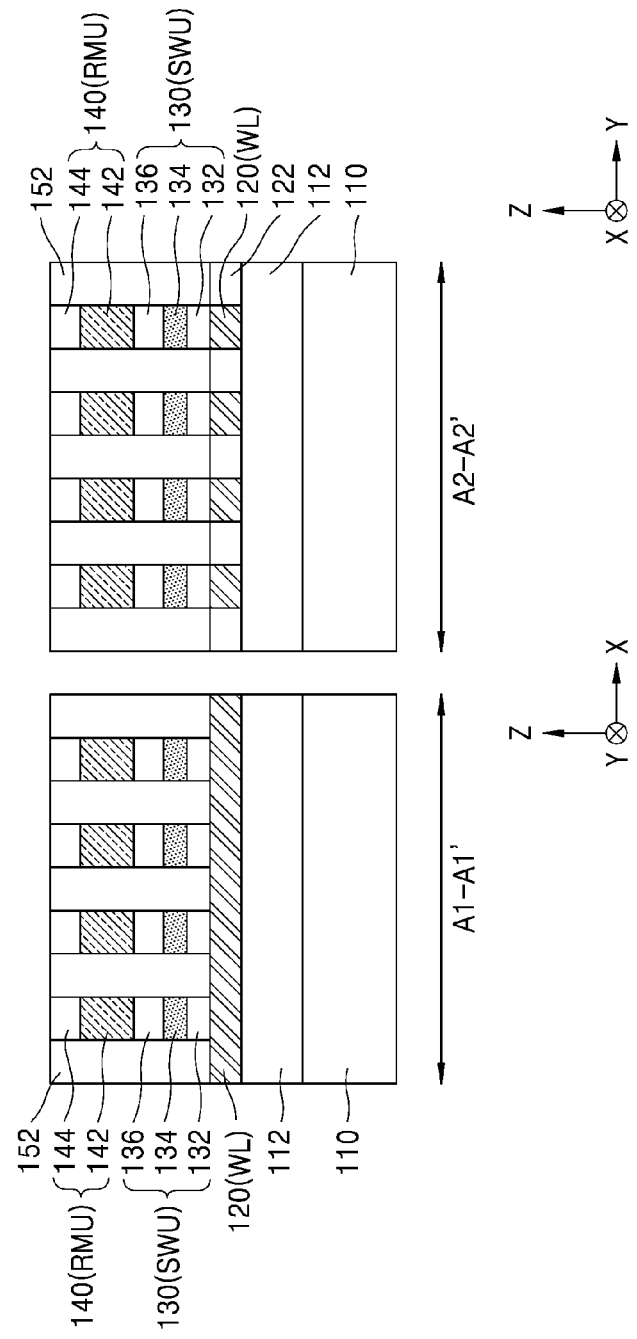

Referring to FIG. 10, the memory cell stack MCS may be patterned to form switching units 130 including first electrodes 132, switching material layers 134, and second electrodes 136 and variable resistance memory units 140 including variable resistance material layers 142 and third electrodes 144.

In an implementation, an island type of mask layer may be formed on the memory cell stack MCS, and the memory cell stack MCS may be patterned using the mask layer as an etch mask to form the switching units 130 and the variable resistance memory units 140.

In an implementation, the first electrode material layers 132L, the preliminary switching material layers 134L, and the second electrode material layers 136L may be first formed and patterned to first form the switching units 130, and then the preliminary variable resistance material layers 142L and the third electrode material layers 144L may be formed and patterned to form the variable resistance memory units 140.

In an implementation, the memory cell stack MCS may be formed, and the preliminary variable resistance material layers 142L and the third electrode material layers 144L may be first patterned to first form the variable resistance memory units 140, and then the first electrode material layers 132L, the preliminary switching material layers 134L, and the second electrode material layers 136L may be patterned to form the switching units 130. In an implementation, before forming the switching units 130, a process for forming liners on sidewalls of the variable resistance memory units 140 may be further performed.

In an implementation, the memory cell stack MCS may be formed and first patterned using a first line-shaped mask extending lengthwise in a second direction (Y direction), and then patterned using a second line-shaped mask extending lengthwise in a first direction (X direction) to have a plurality of island shapes.

Thereafter, an insulating material may be formed on the switching units 130 and the variable resistance memory units 140, and an upper portion of the insulating material may be planarized or etched back so that top surfaces of the variable resistance memory units 140 are exposed, to form a second insulating layer 152.

Figure 11:
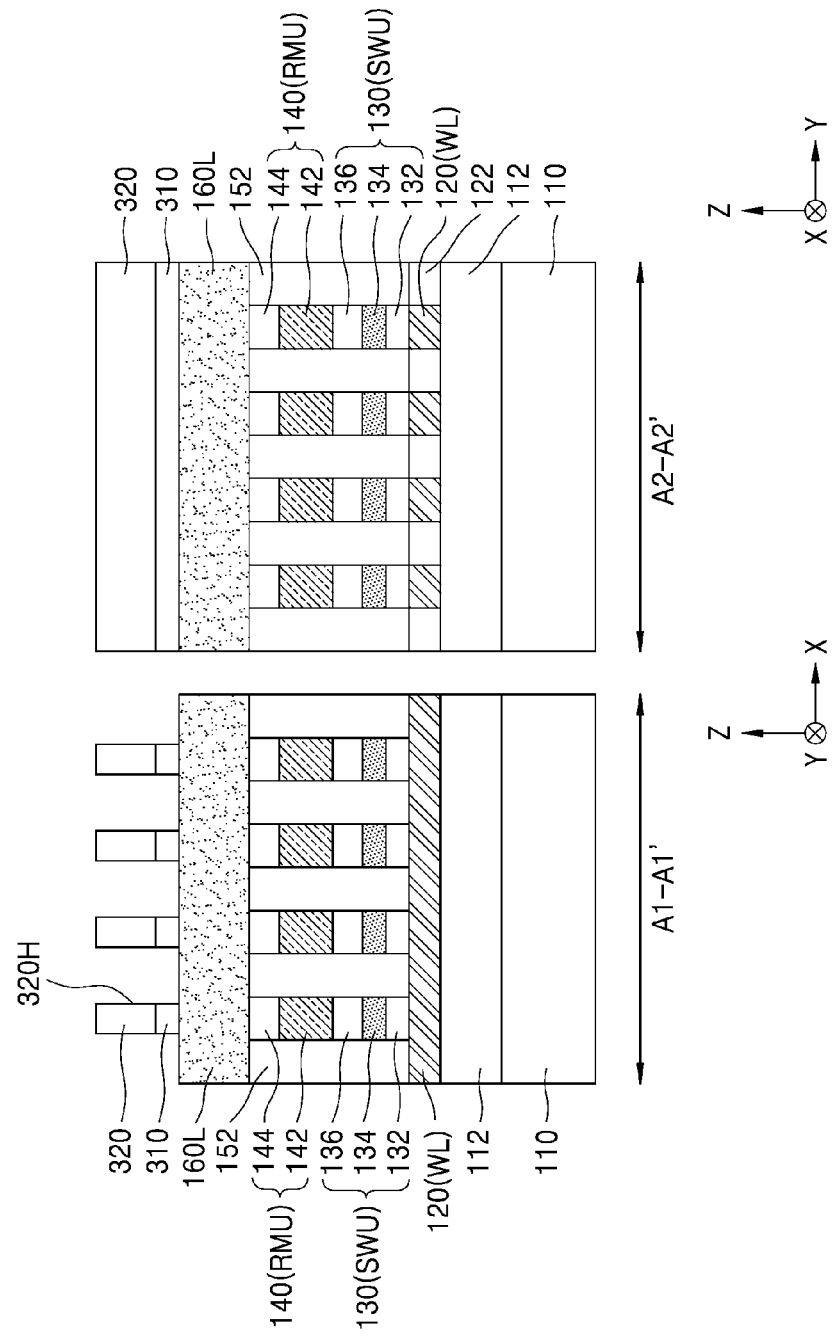

Referring to FIG. 11, a second conductive layer 160L may be formed on the second insulating layer 152. In an implementation, the second conductive layer 160L may be formed at a first height h11 in the Z direction (refer to FIG. 4) of, e.g., about 30 nm to about 150 nm.

Thereafter, a lower layer 310 and a mask pattern 320 may be formed on the second conductive layer 160L. The lower layer 310 and the mask pattern 320 may have line shapes extending in the second direction (the Y direction). The mask pattern 320 may have holes 320H, and a top surface of the second conductive layer 160L may be exposed by the holes 320H.

Figure 12:
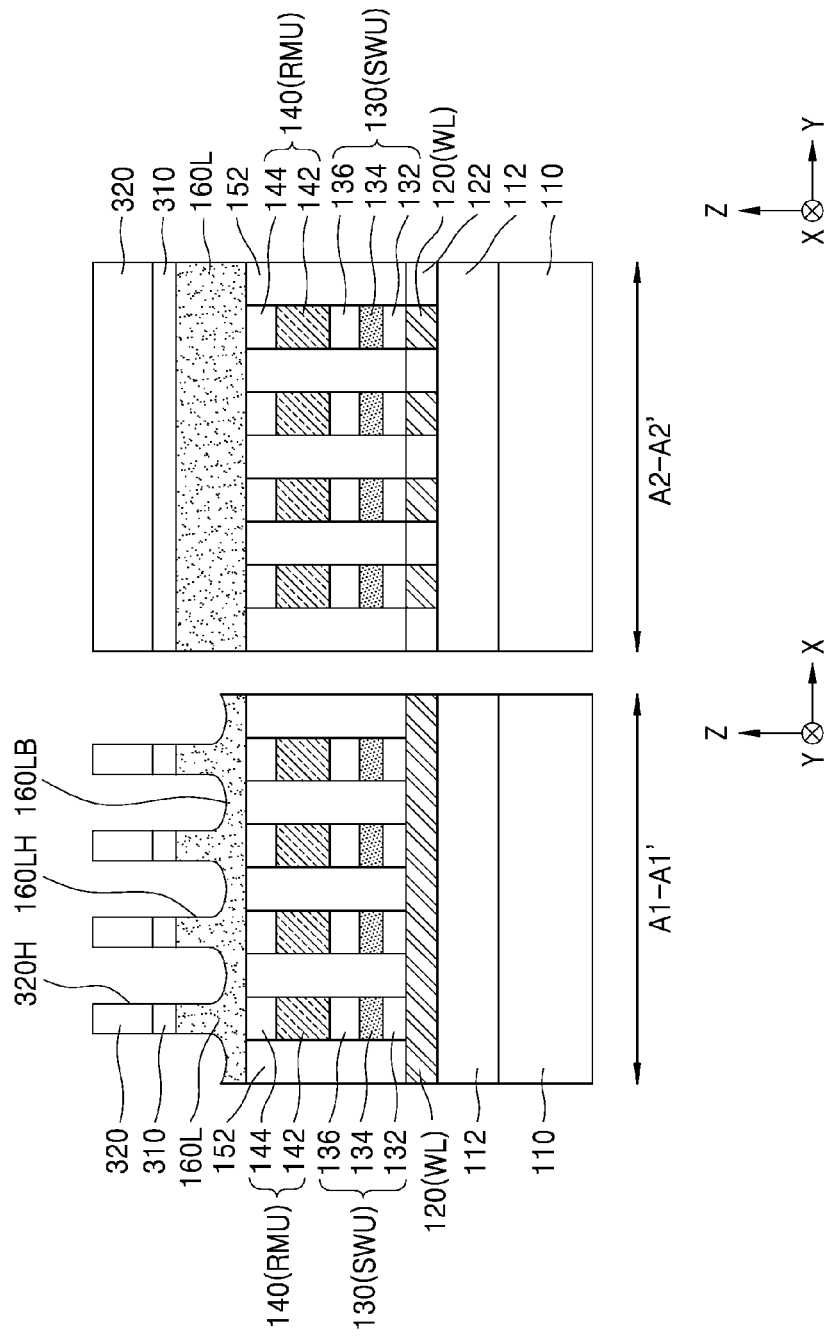

Referring to FIG. 12, a preset height of the second conductive layer 160L exposed by the holes 320H may be removed using the mask pattern 320 as an etch mask. As the preset height of the second conductive layer 160L is removed, sidewalls 160LH and a bottom portion 160LB of the second conductive layer 160L under the holes 320H may be exposed.

In an implementation, an etch height of the second conductive layer 160L may be about 40% to about 90% of the first height h11 of the second conductive layer 160L. The etch height of the second conductive layer 160L may be determined according to an etch profile of the second conductive layer 160L, e.g., the sidewalls 160LH of the second conductive layer 160L, may be determined at a height having vertical sidewall profiles. In an implementation, as shown in FIG. 12, a boundary between the bottom portion 160LB and the sidewalls 160LH of the second conductive layer 160L may be rounded or curved.

Figure 13:
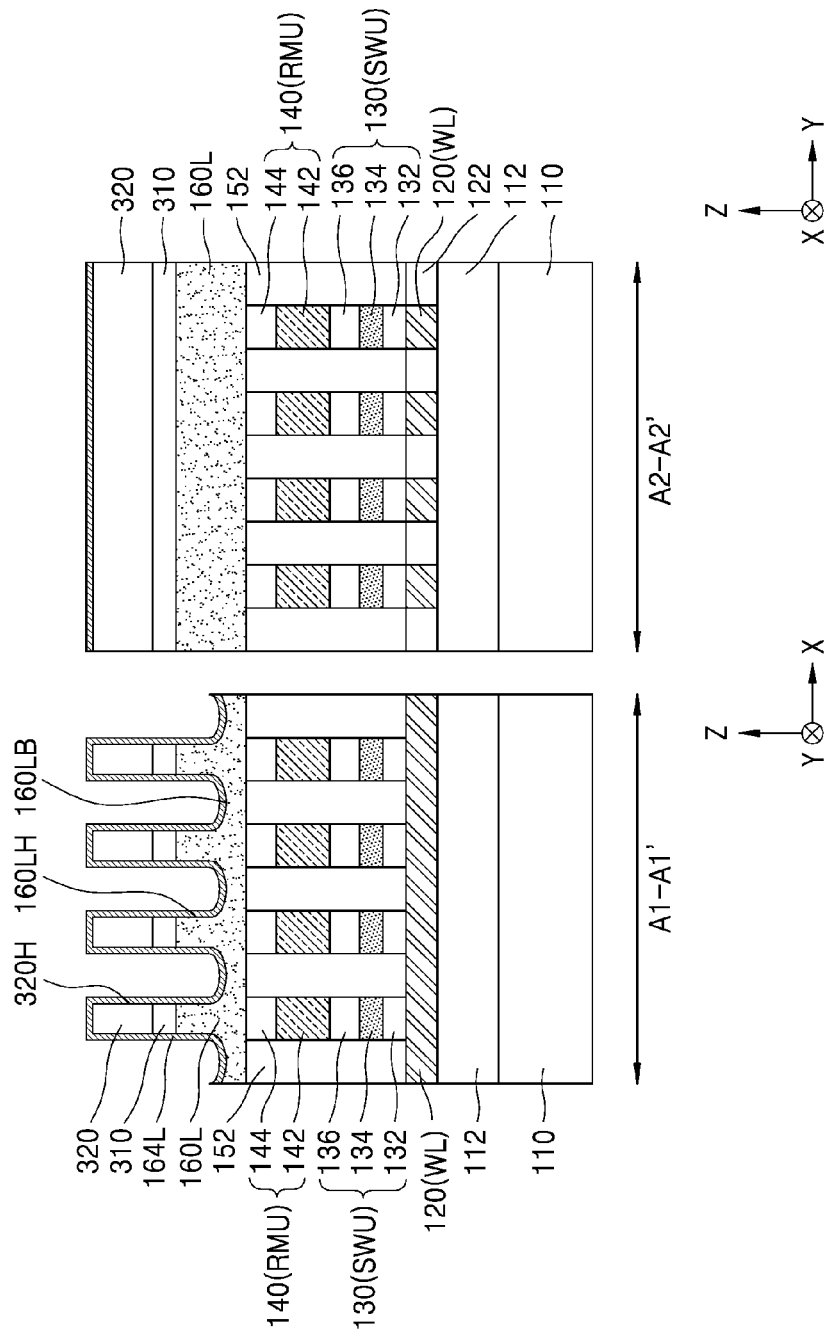

Referring to FIG. 13, a capping liner layer 164L may be formed on the mask pattern 320 and the bottom portion 160LB and the sidewalls 160LH of the second conductive layer 160L.

In an implementation, the capping liner layer 164L may be formed by an ALD process or a CVD process using, e.g., silicon oxide, silicon nitride, silicon carbide, silicon oxycarbide, or silicon. In an implementation, the capping liner layer 164L may be formed to a first thickness w12 (refer to FIG. 4) of about 1 nm to about 4 nm, and may be conformally formed on inner walls of the holes 320H, and the bottom portion 160LB and the sidewalls 160LH of the second conductive layer 160L.

Figure 14:
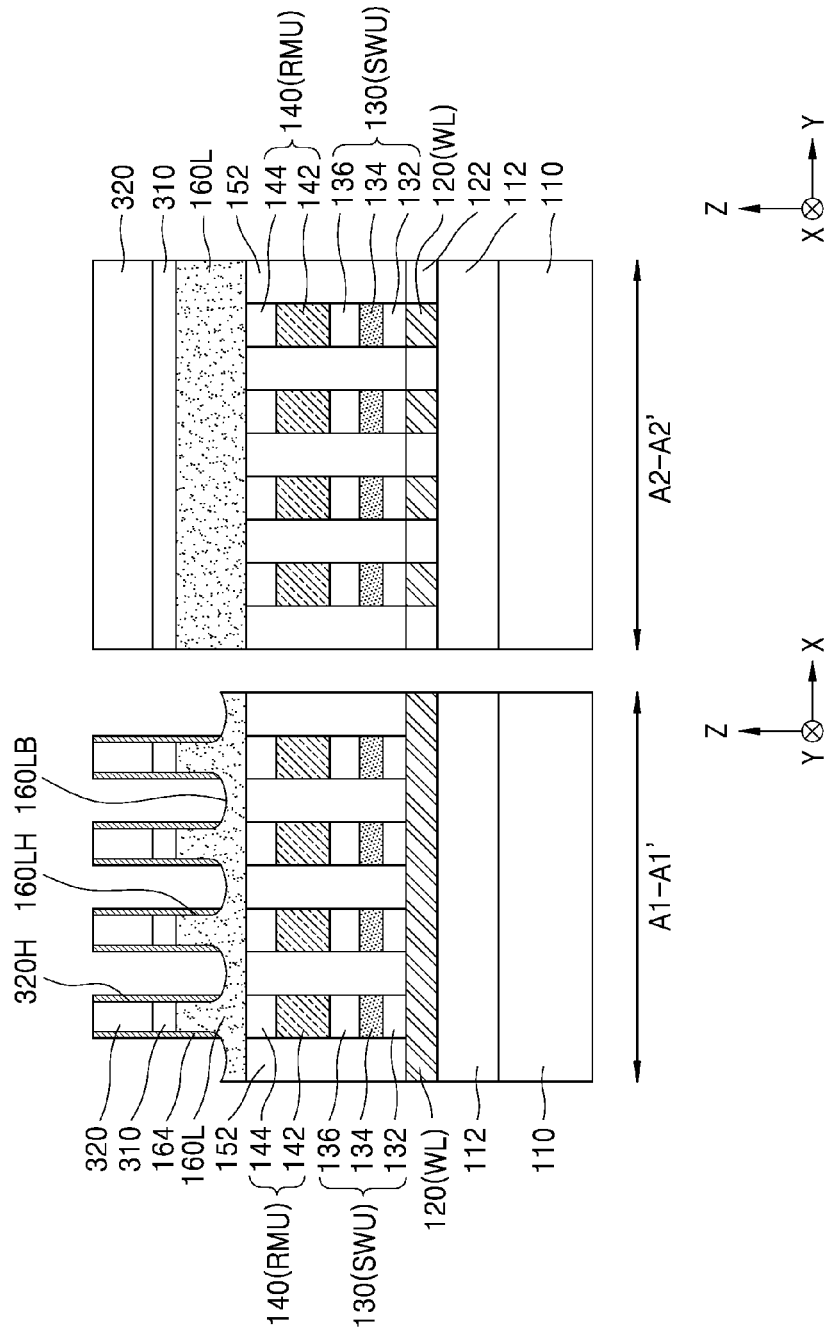

Referring to FIG. 14, an anisotropic etching process may be performed on the capping liner layer 164L to remove the capping liner layer 164L from the bottom portion 160LB of the second conductive layer 160L and a top surface of the mask pattern 320 and leave a pair of capping liners 164 on sidewalls of each of the holes 320H and the sidewalls 160LH of the second conductive layer 160L.

Figure 15:
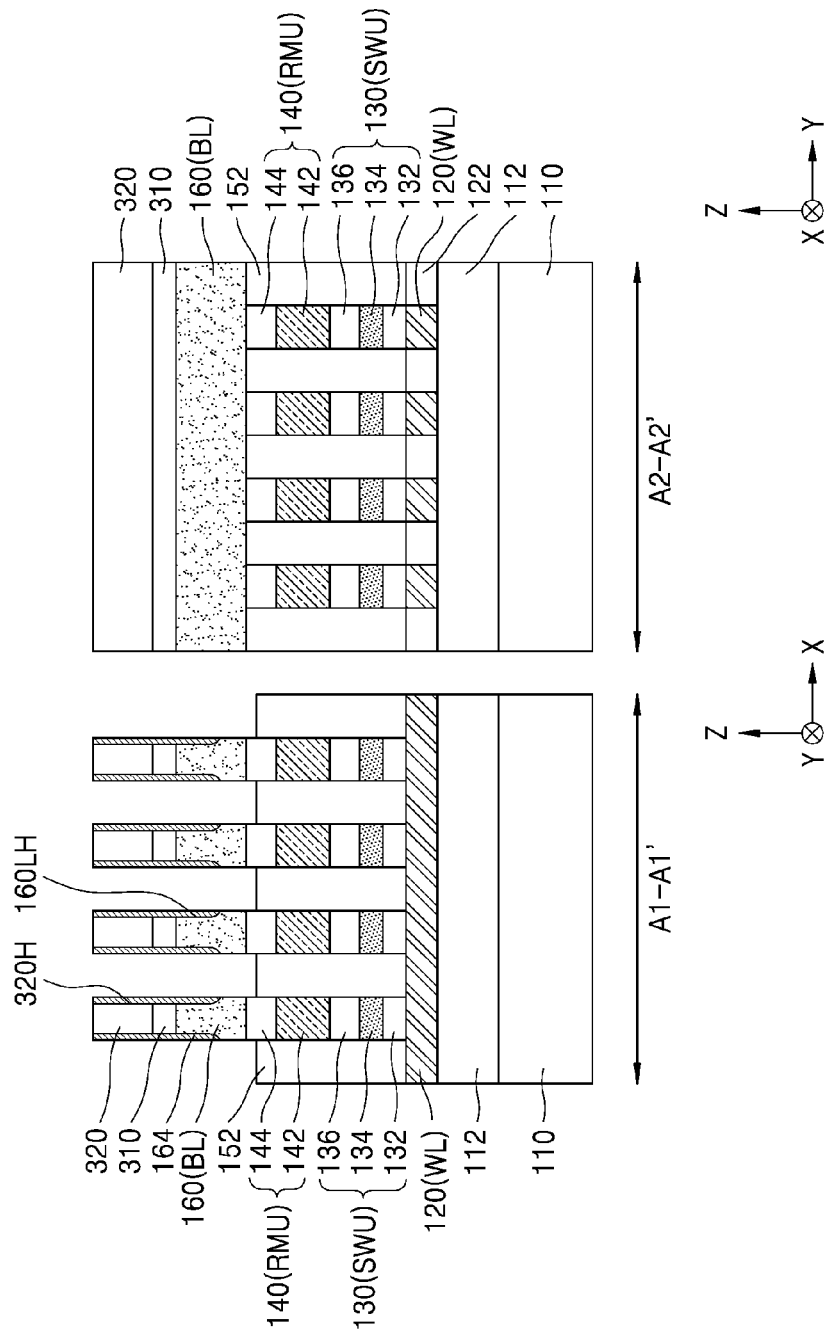

Referring to FIG. 15, the bottom portion 160LB of the second conductive layer 160L exposed by the holes 320H may be removed using the mask pattern 320 and the pair of capping liners 164 as etch masks to form a plurality of second conductive lines 160.

In an implementation, a portion of an upper portion of the second insulating layer 152 may be removed together in the process of removing the bottom portion 160LB of the second conductive layer 160L. A level of a top surface of the second insulating layer 152 exposed at bottom portions of the holes 320H may be lower than a level of a bottom surface of the second conductive layer 160L. Therefore, each of the plurality of second conductive lines 160 may be fully separated from an adjacent second conductive line 160, and sufficient separation distances between the plurality of second conductive lines 160 may be secured.

In the process of removing the bottom portion 160LB of the second conductive layer 160L, the pair of capping liners 164 may cover upper portions of the sidewalls 160LH of the second conductive layer 160L to help prevent undesirable etching, erosion, or bowing of the sidewalls 160LH of the second conductive layer 160L. Therefore, the plurality of second conductive lines 160 may have substantially vertical or flat sidewall profiles.

Figure 16:
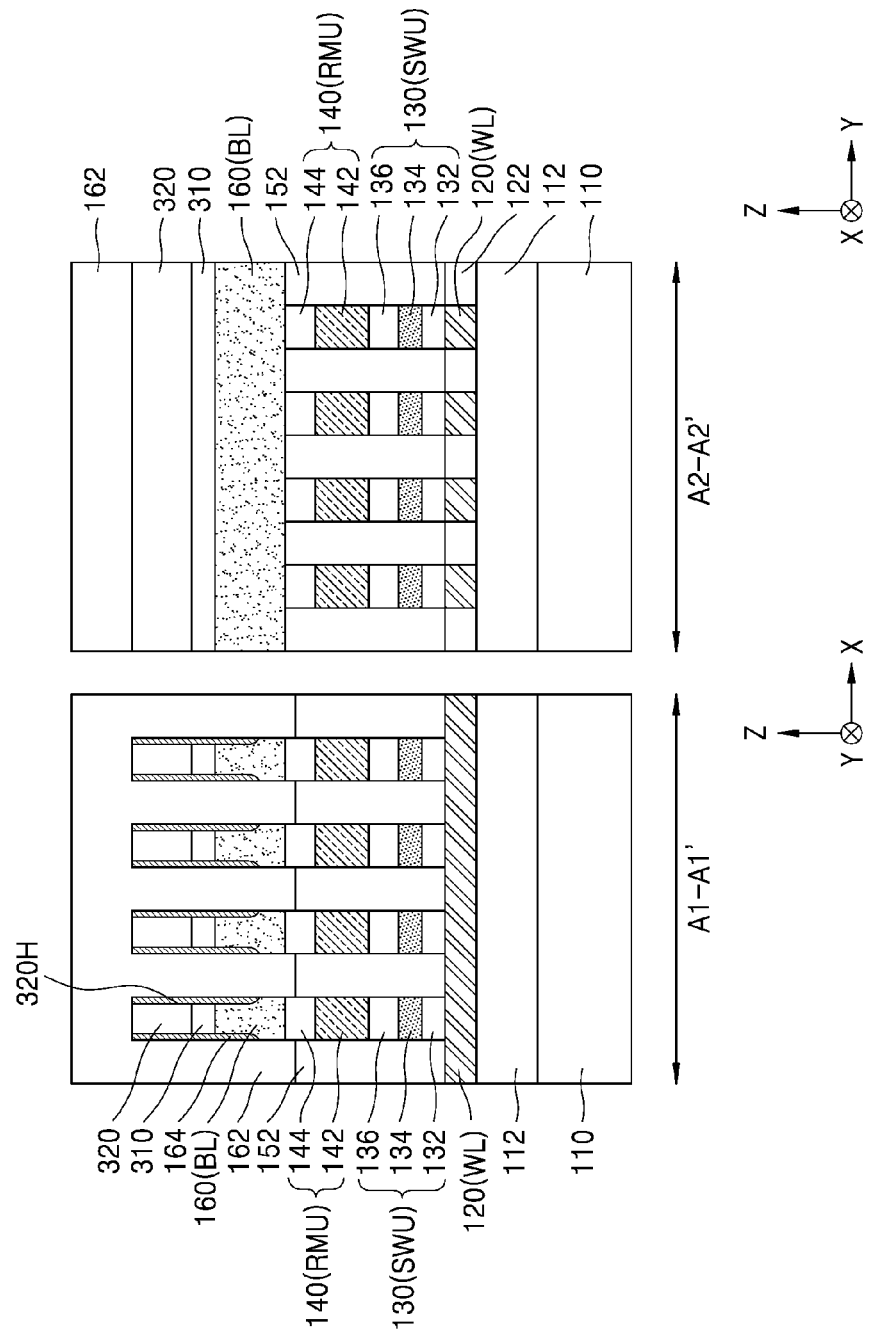

Referring to FIG. 16, a third insulating layer 162 may be formed on the plurality of second conductive lines 160 and the mask pattern 320. The third insulating layer 162 may fill the insides of the holes 320H and contact sidewalls of the pair of capping liners 164.

Figure 17:
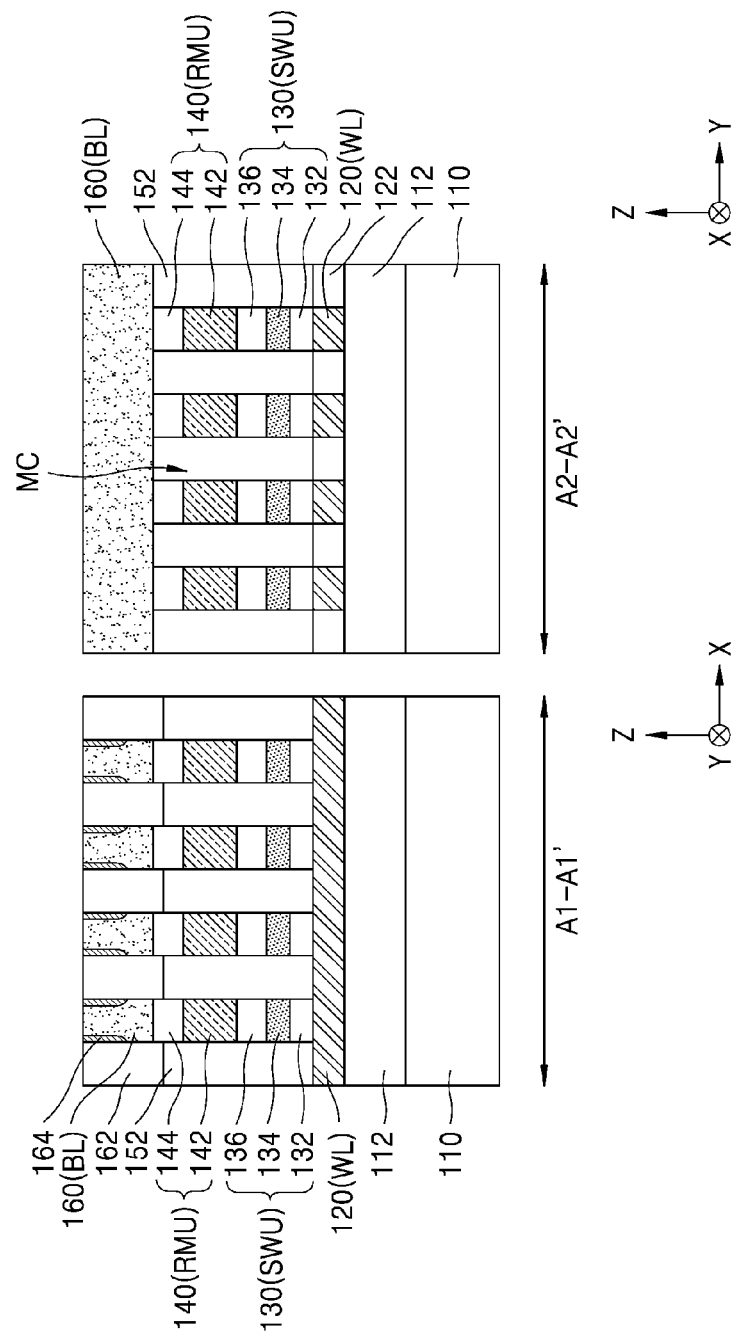

Referring to FIG. 17, an upper portion of the third insulating layer 162 may be planarized so that top surfaces of the plurality of second conductive lines 160 are exposed.

In this case, the mask pattern 320 and the lower layer 310 may also be removed together.

As a result, the memory device 100 may be manufactured.

According to the method of manufacturing the memory device 100 described above, etching may be stopped before fully etching the second conductive layer 160L, the pair of capping liners 164 may be formed on the sidewalls 160LH of the second conductive layer 160L, and then the second conductive layer 160L may be overetched to form the plurality of second conductive lines 160. While overetching the second conductive layer 160L, the pair of capping liners 164 may serve as protection layers that prevent etching or erosion of the sidewalls of the second conductive layer 160L. Therefore, undesirable erosion, bowing, or recess formation of the sidewalls of the plurality of second conductive lines 160 may be reduced or prevented, and the sidewalls of the plurality of second conductive lines 160 may have vertical or relatively flat profiles. As a result, a reduction in an etch rate in a subsequent patterning process of the memory cells MC may be reduced or prevented, and the plurality of second conductive lines 160 may have relatively low resistance. Accordingly, the memory device 100 may have high reliability.

FIGS. 18 through 26 are cross-sectional views of stages in a method of manufacturing the memory device 100A, according to example embodiments.

Figure 18:
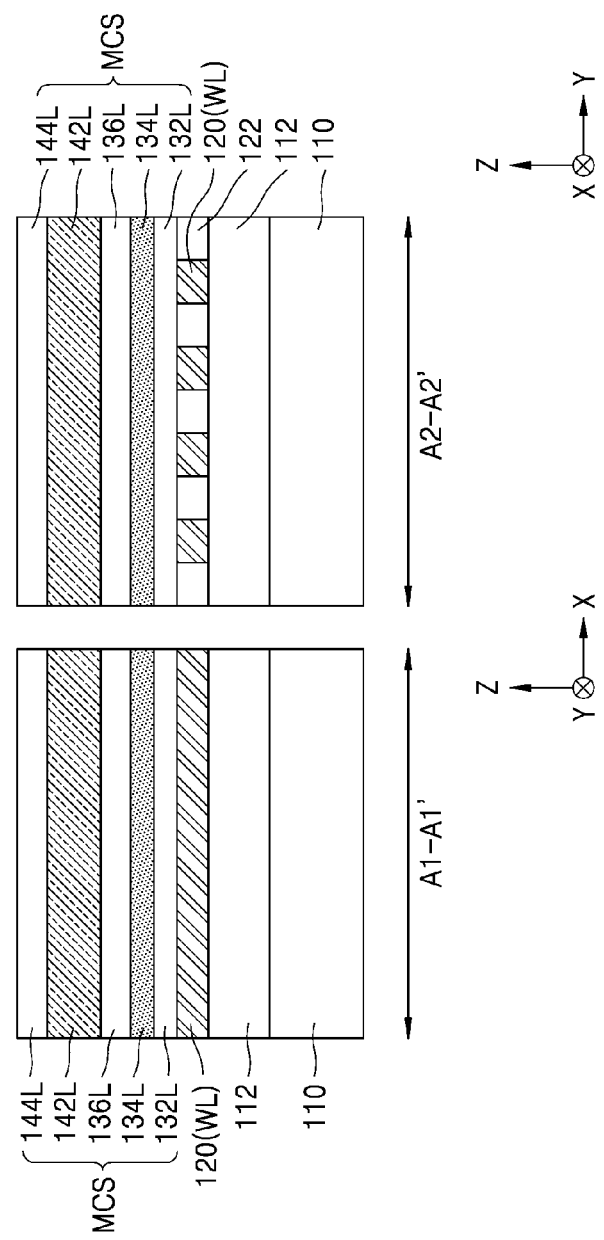
FIGS. 18 through 26 are cross-sectional views of stages in a method of manufacturing a memory device, according to example embodiments.

Referring to FIG. 18, the process described with reference to FIG. 9 may be performed to form a plurality of first conductive lines 120 and a memory cell stack MCS.

Figure 19:
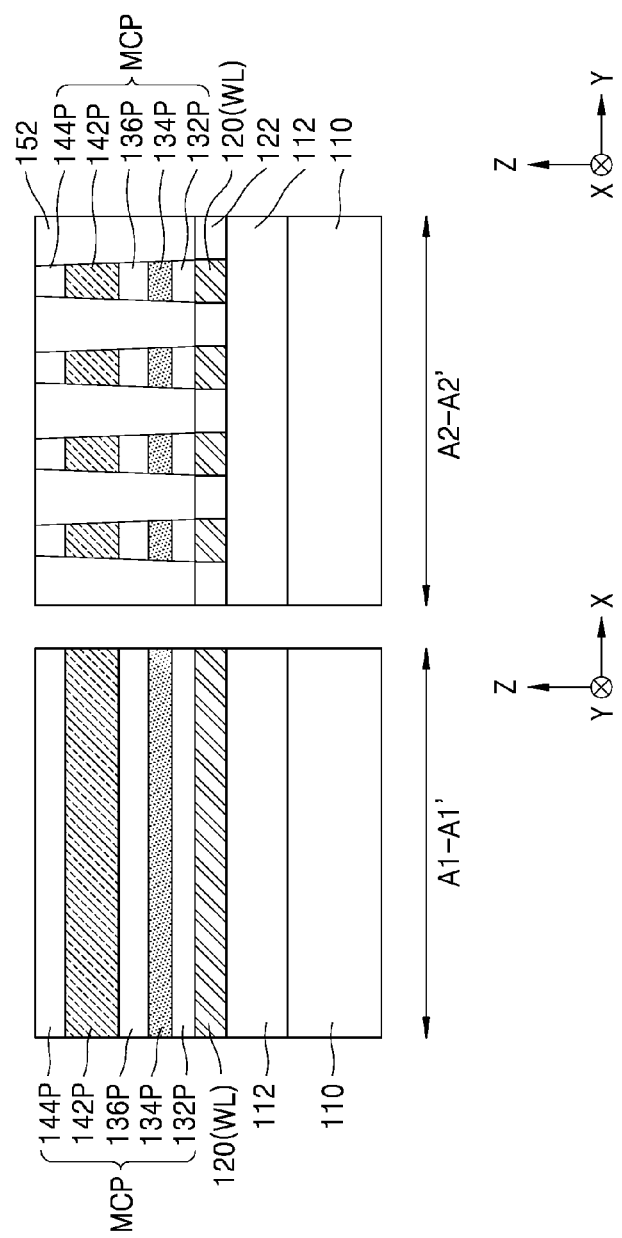

Referring to FIG. 19, a line-shaped mask pattern extending in a first direction (X direction) may be formed on the memory cell stack MCS. The memory cell stack MCS may be patterned using the line-shaped mask pattern to form memory cell patterns MCP extending in the first direction (the X direction). The memory cell patterns MCP may include first electrode patterns 132P, switching material layer patterns 134P, second electrode patterns 136P, variable resistance material layer patterns 142P, and third electrode patterns 144P that respectively extend in the first direction (the X direction).

Thereafter, spaces between the memory cell patterns MCP may be filled with an insulating material, and then the insulating material may be planarized so that top surfaces of the memory cell patterns MCP are exposed, to form a second insulating layer 152. Here, the line-shaped mask pattern may also be removed together.

Figure 20:
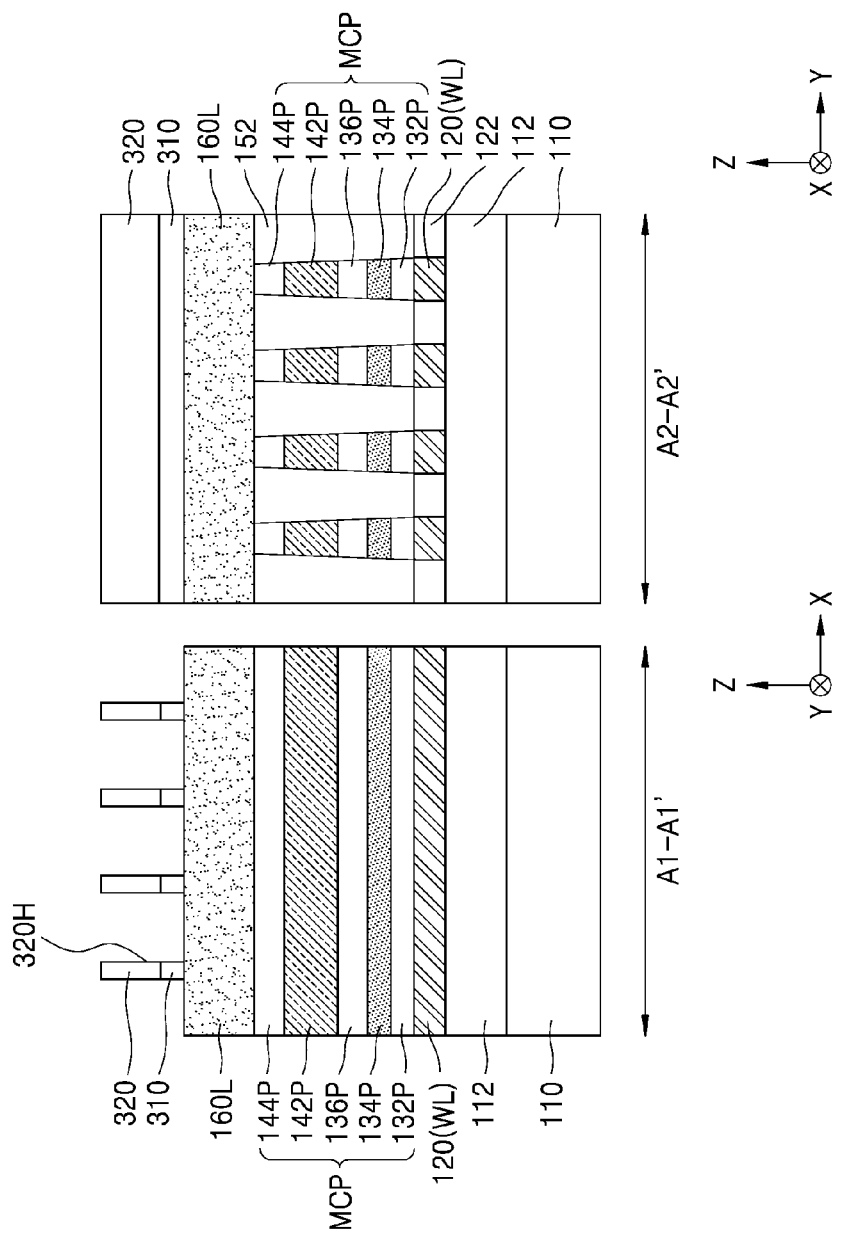

Referring to FIG. 20, a second conductive layer 160L may be formed on the memory cell patterns MCP and the second insulating layer 152. Thereafter, a lower layer 310 and a mask pattern 320 having line shapes and extending in a second direction (Y direction) may be formed on the second conductive layer 160L. The mask pattern 320 may have holes 320H, and a top surface of the second conductive layer 160L may be exposed by the holes 320H.

Figure 21:
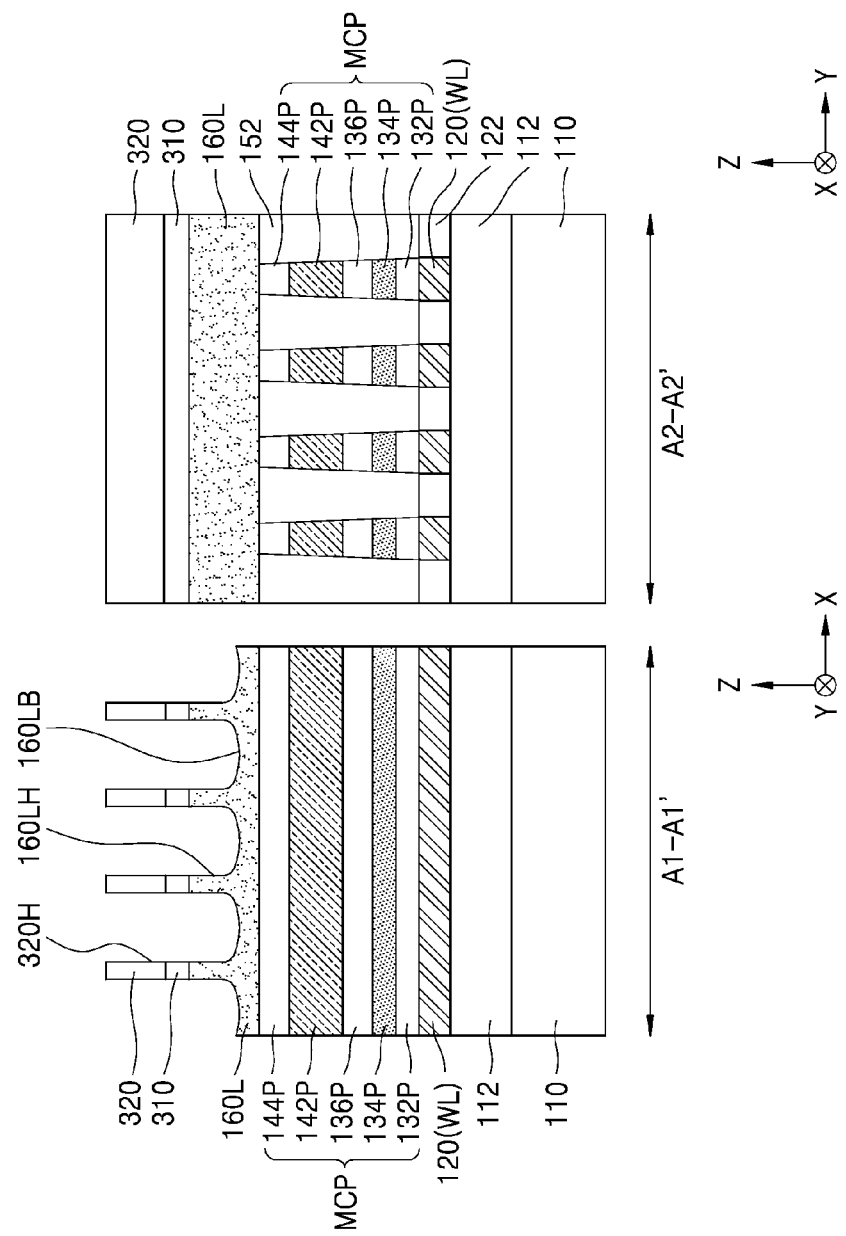

Referring to FIG. 21, a preset height of the second conductive layer 160L exposed by the holes 320H may be removed using the mask pattern 320 as an etch mask. As the preset height of the second conductive layer 160L is removed, sidewalls 160LH and a bottom portion 160LB of the second conductive layer 160L under the holes 320H may be exposed.

Figure 22:
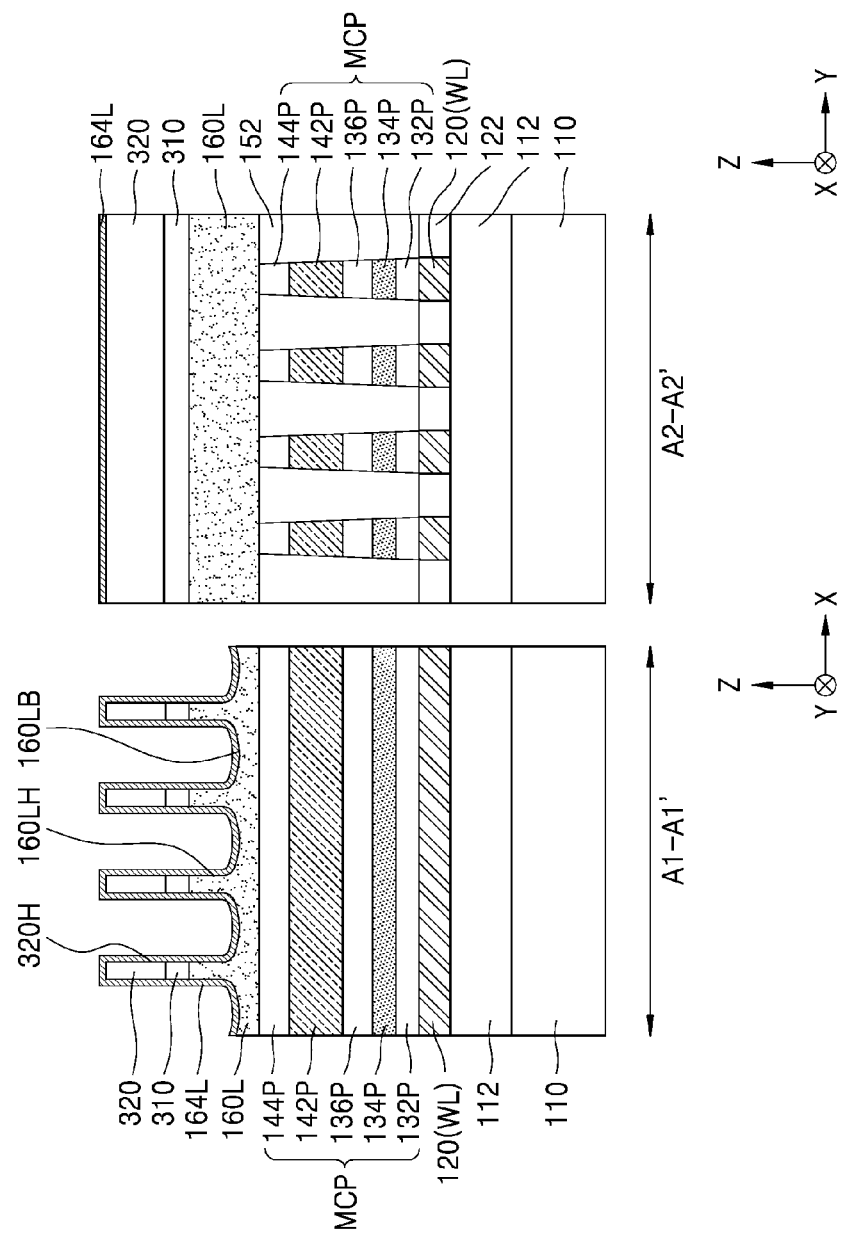

Referring to FIG. 22, a capping liner layer 164L may be formed on the mask pattern 320, and the bottom portion 160LB and the sidewalls 160LH of the second conductive layer 160L. The capping liner layer 164L may be conformally formed on inner walls of the holes 320H, and the bottom portion 160LB and the sidewalls 160LH of the second conductive layer 160L.

Figure 23:
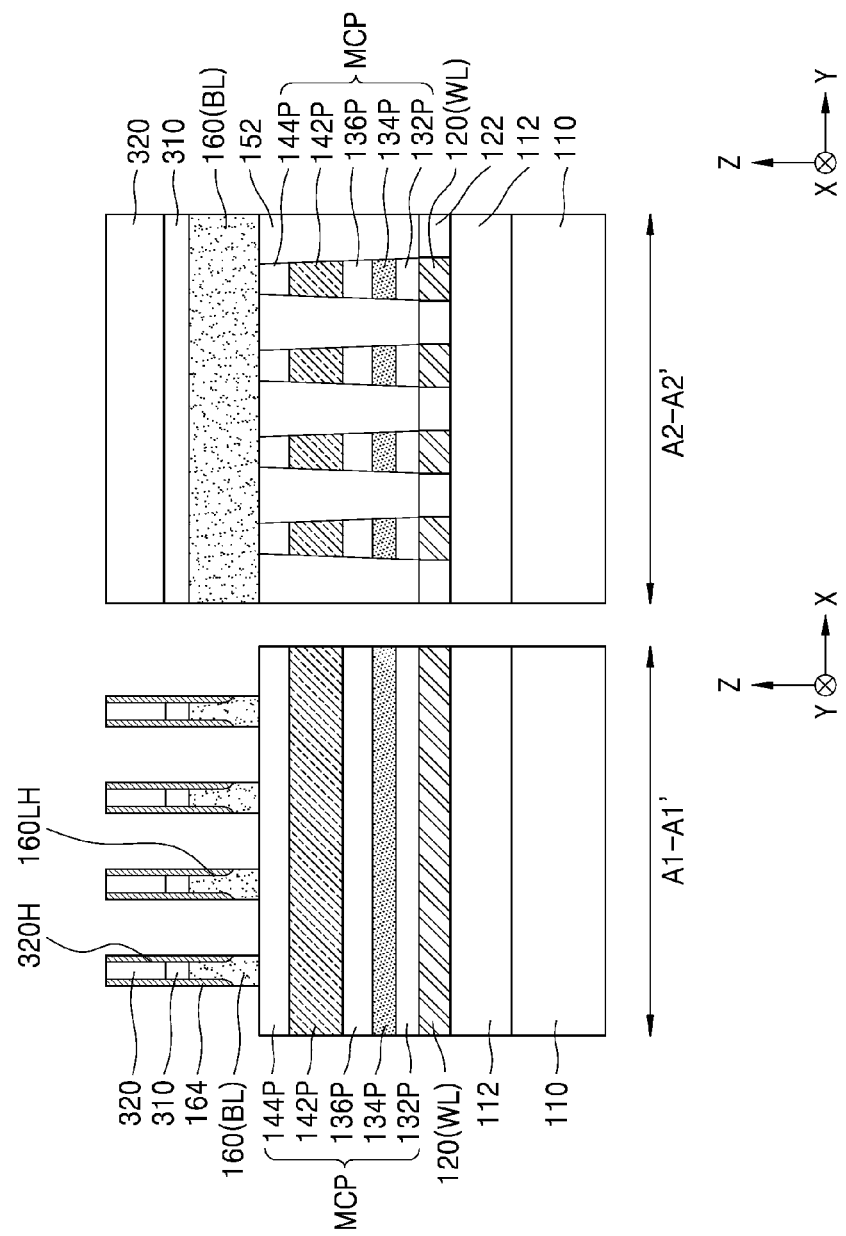

Referring to FIG. 23, an anisotropic etching process may be performed on the capping liner layer 164L to remove the capping liner layer 164L arranged on the bottom portion 160LB of the second conductive layer 160L and a top surface of the mask pattern 320 and leave a pair of capping liners 164 on the sidewalls of the holes 320H and the sidewalls 160LH of the second conductive layer 160L.

Thereafter, the bottom portion 160LB of the second conductive layer 160L exposed by the holes 320H may be removed using the mask pattern 320 and the pair of capping liners 164 as etch masks to form a plurality of second conductive lines 160.

In an implementation, in the process of removing the bottom portion 160LB of the second conductive layer 160L to form the plurality of second conductive lines 160, the pair of capping liners 164 may cover upper portions of the sidewalls 160LH of the second conductive layer 160L to help prevent undesirable etching, erosion, or bowing of the sidewalls 160LH of the second conductive layer 160L. Therefore, the plurality of second conductive lines 160 may have substantially vertical or flat sidewall profiles, and sufficient separation distances between the plurality of second conductive lines 160 may be secured.

Figure 24:
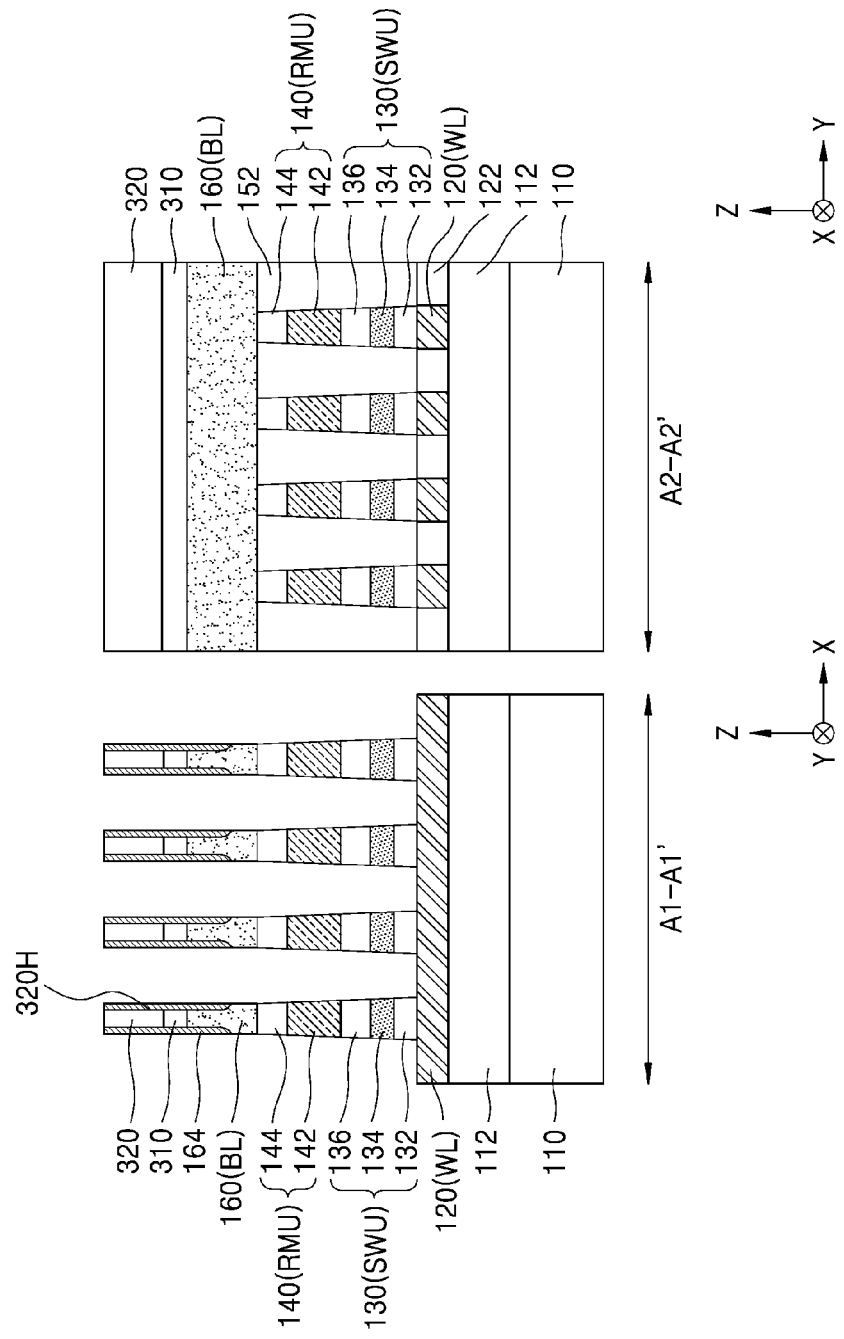

Referring to FIG. 24, memory cell patterns MCP may be patterned using the mask pattern 320 and the pair of capping liners 164 as etch masks to sequentially form variable resistance memory units 140 and switching units 130.

In an implementation, sidewalls of the variable resistance memory units 140 and the switching units 130 may be inclined at a preset inclination angle.

Figure 25:
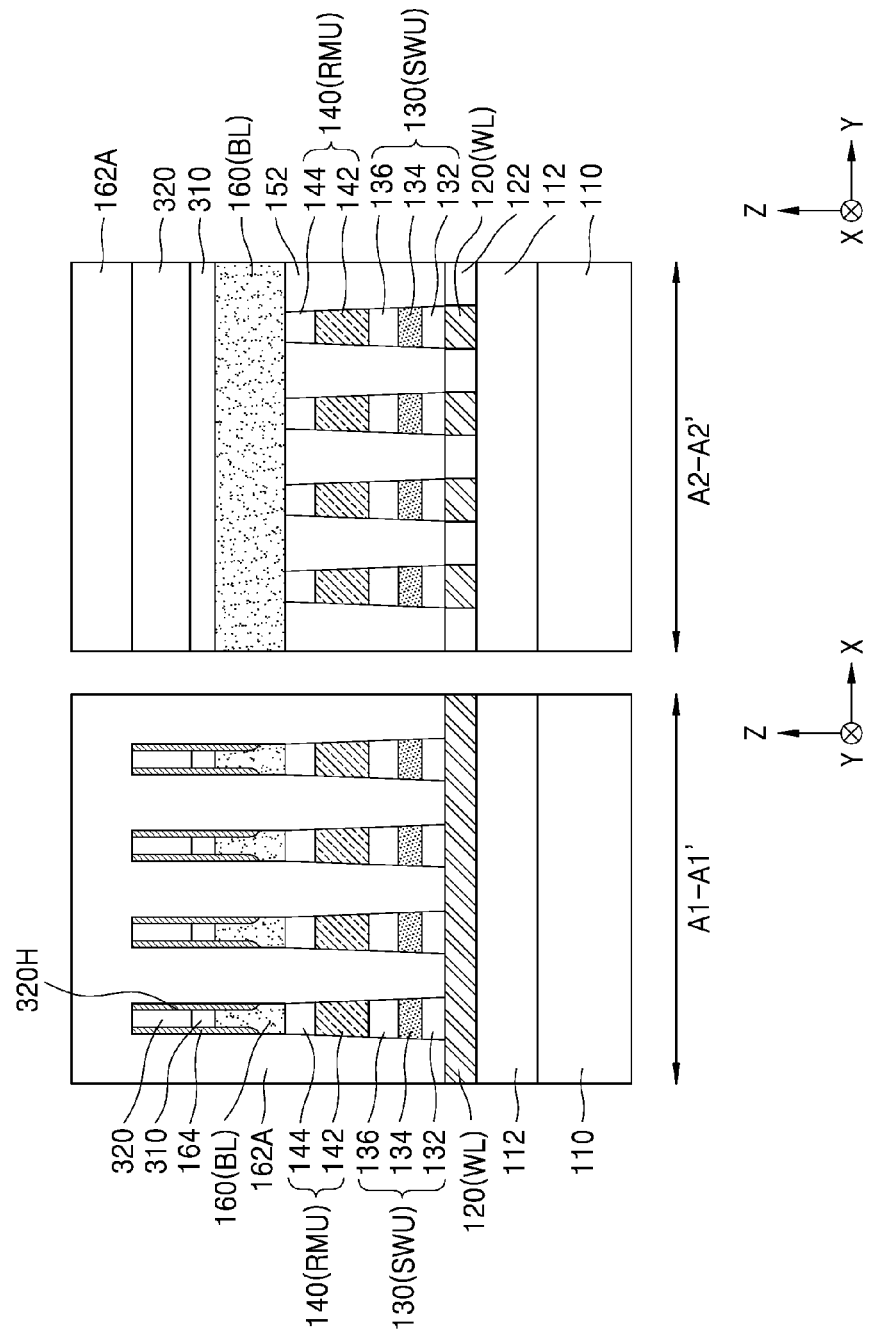

Referring to FIG. 25, a third insulating layer 162A may be formed on the switching units 130, the variable resistance memory units 140, the plurality of second conductive lines 160, and the mask pattern 320. The third insulating layer 162A may fill the insides of the holes 320H, contact top surfaces of the plurality of first conductive lines 120 exposed at bottom portions of the holes 320H, and contact sidewalls of the pair of capping liners 164.

Figure 26:
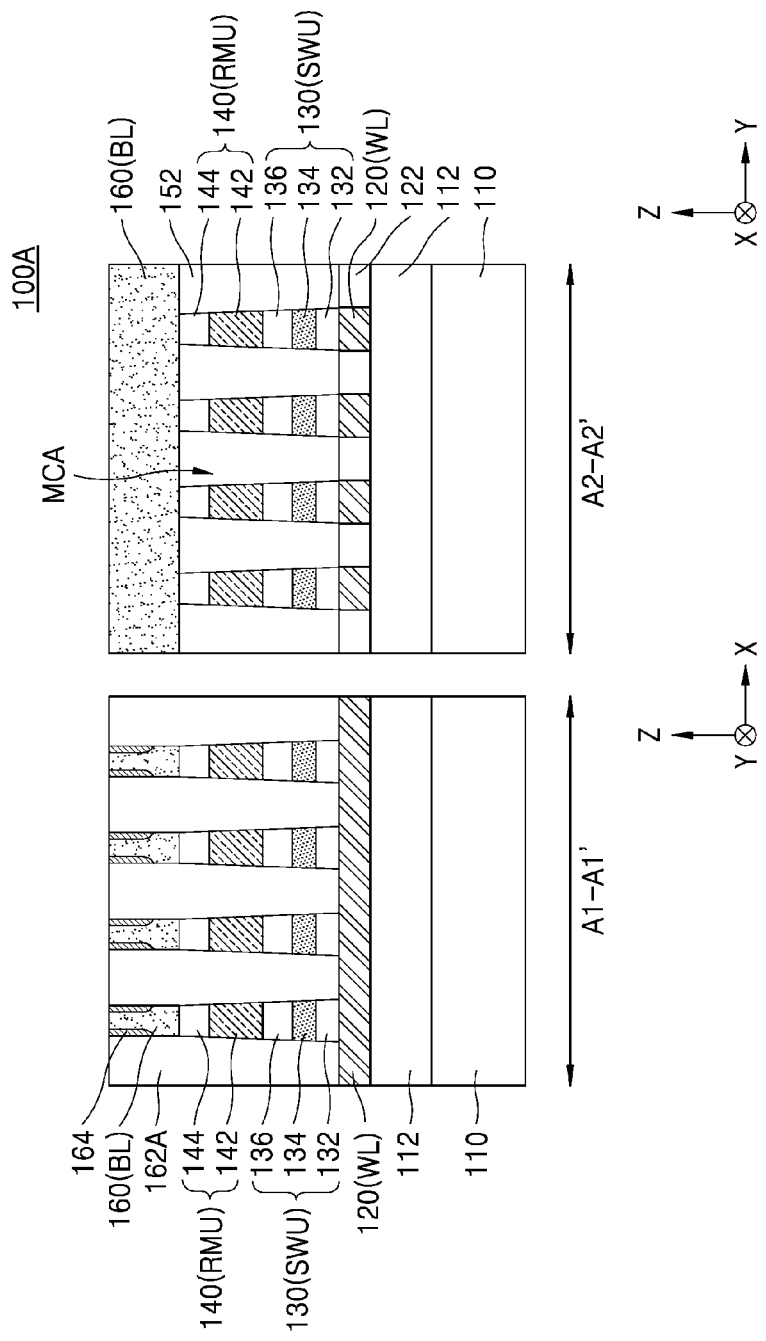

Referring to FIG. 26, an upper portion of the third insulating layer 162A may be planarized so that top surfaces of the plurality of second conductive lines 160 are exposed. In this process, the mask pattern 320 and the lower layer 310 may also be removed together.

As a result, the memory device 100A may be formed.

According to the method of manufacturing the memory device 100A described above, while overetching the second conductive layer 160L, the pair of capping liners 164 may serve as protection layers that help prevent etching or erosion of sidewalls of the second conductive layer 160L. Therefore, undesirable erosion, bowing, or recess formation of sidewalls of the plurality of second conductive lines 160 may be reduced or prevented, and the sidewalls of the plurality of second conductive lines 160 may have vertical or relatively flat profiles. As a result, a reduction in an etch rate in the patterning process of the memory cell patterns MCP may be reduced or prevented, and the plurality of second conductive lines 160 may have relatively low resistance. Accordingly, the memory device 100A may have high reliability.

By way of summation and review, when patterning process defects of conductive lines occur in manufacturing processes of cross point structures, the resistance of the conductive lines may increase, and thus, variations in electrical performances between cells of memory devices could occur or the reliability of the memory devices could deteriorate.

One or more embodiments may provide a memory device having a cross-point array structure.

One or more embodiments may provide a cross point-type of memory device capable of securing stable operations of memory cells by preventing poor patterning or bowing of conductive lines in a patterning process of a cross-point array.

One or more embodiments may provide a method of manufacturing a cross-point type of memory device capable of preventing poor patterning or bowing of conductive lines in a patterning process of a cross-point array.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a plurality of first conductive lines arranged on a substrate and spaced apart from each other in a first direction parallel to a top surface of the substrate;
a plurality of capping liners on sidewalls of each of the plurality of first conductive lines, the plurality of capping liners having:
top surfaces at a vertical level equal to top surfaces of the plurality of first conductive lines, and
bottom surfaces at a vertical level higher than bottom surfaces of the plurality of first conductive lines; and
an insulating layer on the substrate, the insulating layer filling spaces between the plurality of first conductive lines and covering sidewalls of the plurality of capping liners.

2. The memory device as claimed in claim 1, wherein:
an upper portion of the insulating layer contacts the sidewalls of the plurality of capping liners, and
a lower portion of the insulating layer contacts sidewalls of the plurality of first conductive lines.

3. The memory device as claimed in claim 1, wherein the insulating layer has a top surface that is at a vertical level equal to the top surfaces of the plurality of first conductive lines and a bottom surface that is at a vertical level lower than bottom surfaces of the plurality of first conductive lines.

4. The memory device as claimed in claim 1, wherein the sidewalls of the plurality of capping liners are aligned with the sidewalls of the plurality of first conductive lines to form a straight line with the sidewalls of the plurality of first conductive lines.

5. The memory device as claimed in claim 1, further comprising:
a plurality of second conductive lines arranged on the substrate and spaced apart from each other in a second direction parallel to the top surface of the substrate and at a vertical level lower than the plurality of first conductive lines; and
a plurality of memory cells respectively arranged between the plurality of first conductive lines and the plurality of second conductive lines.

6. The memory device as claimed in claim 5, wherein each of the plurality of memory cells includes:
a switching unit including an ovonic threshold switching material, and
a memory unit including a variable resistance material.

7. A memory device, comprising:
a plurality of first conductive lines on a substrate and spaced apart from each other in a first direction parallel to a top surface of the substrate;
a plurality of second conductive lines on the substrate and spaced apart from each other in a second direction parallel to the top surface of the substrate and at a vertical level lower than the plurality of first conductive lines;
a plurality of memory cells respectively arranged between the plurality of first conductive lines and the plurality of second conductive lines; and
a plurality of capping liners on sidewalls of each of the plurality of first conductive lines, the plurality of capping liners having top surfaces at a vertical level equal to top surfaces of the plurality of first conductive lines and bottom surfaces at a vertical level higher than bottom surfaces of the plurality of first conductive lines.

8. The memory device as claimed in claim 7, wherein lower sidewalls of the plurality of first conductive lines are not covered by the plurality of capping liners.

9. The memory device as claimed in claim 7, wherein:
the plurality of first conductive lines each have a first height in a third direction perpendicular to the top surface of the substrate,
the plurality of capping liners each have a second height in the third direction, and
the second height is about 40% to about 90% of the first height.

10. The memory device as claimed in claim 9, wherein:
the first height is about 30 nm to about 150 nm, and
the plurality of capping liners each have a thickness of about 1 nm to about 4 nm.

11. The memory device as claimed in claim 7, wherein:
the plurality of first conductive lines each have a first height in a third direction perpendicular to the top surface of the substrate and each have a first width in the first direction, and
a ratio of the first height to the first width is about 0.5 to about 5.

12. The memory device as claimed in claim 7, further comprising an insulating layer filling spaces between the plurality of first conductive lines and having a top surface that is at a vertical level equal to the top surfaces of the plurality of first conductive lines and a bottom surface that is at a vertical level lower than the bottom surfaces of the plurality of first conductive lines.

13. The memory device as claimed in claim 12, wherein:
an upper portion of the insulating layer contacts sidewalls of the plurality of capping liners, and
a lower portion of the insulating layer contacts the sidewalls of the plurality of first conductive lines.

14. A memory device, comprising:
a plurality of first conductive lines on a substrate and spaced apart from each other in a first direction parallel to a top surface of the substrate;
a plurality of second conductive lines on the substrate and spaced apart from each other in a second direction parallel to the top surface of the substrate and at a vertical level lower than the plurality of first conductive lines;

a plurality of first memory cells respectively between the plurality of first conductive lines and the plurality of second conductive lines;

a plurality of first capping liners on upper sidewalls of each of the plurality of first conductive lines; and an insulating layer on the substrate, the insulating layer filling spaces between the plurality of first conductive lines, wherein:
the upper sidewalls of the plurality of first conductive lines are covered by the plurality of first capping liners, and lower sidewalls of the plurality of first conductive lines are covered by the insulating layer.

15. The memory device as claimed in claim 14, wherein the insulating layer has a top surface that is at a vertical level equal to top surfaces of the plurality of first conductive lines and a bottom surface that is at a vertical level lower than bottom surfaces of the plurality of first conductive lines.

16. The memory device as claimed in claim 14, wherein the lower sidewalls of the plurality of first conductive lines are not covered by the plurality of first capping liners.

17. The memory device as claimed in claim 14, further comprising:
a plurality of third conductive lines on the substrate and spaced apart from each other in the second direction at a vertical level higher than the plurality of first conductive lines;

a plurality of second memory cells respectively between the plurality of first conductive lines and the plurality of third conductive lines; and a plurality of second capping liners on upper sidewalls of each of the plurality of third conductive lines.

18. The memory device as claimed in claim 17, further comprising an insulating layer on the substrate, the insulating layer filling spaces between the plurality of third conductive lines and having a top surface that is at a vertical level equal to top surfaces of the plurality of third conductive lines and a bottom surface that is at a vertical level lower than bottom surfaces of the plurality of third conductive lines.

19. The memory device as claimed in claim 17, wherein:
each of the plurality of first memory cells and the plurality of second memory cells includes a switching unit and a memory unit arranged in a third direction perpendicular to the top surface of the substrate, the switching unit includes a first electrode, a switching material layer including an ovonic threshold switching material, and a second electrode, and the memory unit includes a variable resistance material layer and a third electrode.

20. The memory device as claimed in claim 14, wherein:
bottom portions of the plurality of first capping liners are tapered, and sidewalls of the plurality of first capping liners are aligned with the lower sidewalls of the plurality of first conductive lines.

* * * * *